United States Patent [19]
Little et al.

[11] Patent Number: 6,038,655
[45] Date of Patent: Mar. 14, 2000

[54] MICROCONTROLLER HAVING REGISTER DIRECT AND REGISTER INDIRECT ADDRESSING

[75] Inventors: Wendell L. Little, Denton; Stephen N. Grider, Farmers Branch; Joseph Wayne Triece, Flower Mound, all of Tex.

[73] Assignee: Dallas Semiconductor Corporation, Dallas, Tex.

[21] Appl. No.: 08/783,718

[22] Filed: Jan. 16, 1997

Related U.S. Application Data

[63] Continuation of application No. 08/752,953, Nov. 20, 1996, abandoned, which is a continuation of application No. 08/543,689, Oct. 16, 1995, abandoned, which is a continuation of application No. 08/196,273, Feb. 9, 1994, abandoned, which is a division of application No. 08/015,691, Feb. 9, 1993, Pat. No. 5,473,271.

[51] Int. Cl.[7] .................................................. G06F 9/35
[52] U.S. Cl. ................... 712/32; 711/5; 711/214
[58] Field of Search ............................ 375/800; 395/800, 395/32; 711/104, 149, 150, 215, 5, 214, 200; 712/32

[56] References Cited

U.S. PATENT DOCUMENTS

| | | | |
|---|---|---|---|
| 4,079,455 | 3/1978 | Ozga | 395/800.42 |
| 4,398,244 | 8/1983 | Chu et al. | 364/200 |
| 4,434,461 | 2/1984 | Puhl | 364/200 |
| 4,835,738 | 5/1989 | Niehaus et al. | 711/154 |
| 4,857,770 | 8/1989 | Partovi et al. | 307/451 |
| 4,864,162 | 9/1989 | Maoz | 307/296.1 |
| 4,868,735 | 9/1989 | Moller et al. | 364/200 |
| 4,890,263 | 12/1989 | Little | 365/218 |
| 4,945,469 | 7/1990 | Yamada | 364/200 |
| 4,947,477 | 8/1990 | Little | 364/200 |
| 5,077,738 | 12/1991 | Larsen et al. | 371/15.1 |
| 5,235,548 | 8/1993 | Kurkowski | 365/200 |
| 5,269,012 | 12/1993 | Nakajima | 395/425 |
| 5,287,309 | 2/1994 | Kai | 365/189.04 |
| 5,361,338 | 11/1994 | Kobayashi et al. | 712/226 |

OTHER PUBLICATIONS

Mano, M. Morris, *Computer System Architecture*, 1982, pp. 228–283.

*Primary Examiner*—John W. Cabeca
*Assistant Examiner*—Denise Tran
*Attorney, Agent, or Firm*—Jenkens & Gilchrist, A Professional Corporation

[57] ABSTRACT

A microprocessor on-board RAM provides both the usual random access by addressing and a subset of memory cells with their contents continually available on a secondary bus paralleling the data bus. This secondary bus may be used for register indirect addressing without a separate register read when the RAM subset includes the registers for register indirect addressing. The processor also has a two stage output driver for limiting maximum output current and feedback-controlled clock period partitioning.

4 Claims, 40 Drawing Sheets

| | COL(0)-COL(1) | COL(2)-COL(3) | COL(4)-COL(5) | COL(6)-COL(7) | COL(8)-COL(9) | COL(10)-COL(11) | COL(12)-COL(13) | COL(14)-COL(15) | |
|---|---|---|---|---|---|---|---|---|---|
| ROW (31) | E6 | EE | F6 | FE | E7 | EF | F7 | FF | |
| ROW (20) | | | | | | | | | |
| ROW (10) | | | | | | | 55 | | |
| | | | | | | | 53 | | |
| | 40 | | 50 | | | | 51 | | |
| | 26 | | 36 | | | | 37 | | |
| | 24 | | 34 | | | | 35 | | |
| ROW (5) | 22 | 2A | 32 | 3A | 23 | 2B | 33 | 3B | |
| ROW (4) | 20 | 28 | 30 | 38 | 21 | 29 | 31 | 39 | |
| ROW (3) | 06 | 0E | 16 | 1E | 07 | 0F | 17 | 1F | ⎫ |
| ROW (2) | 04 | 0C | 14 | 1C | 05 | 0D | 15 | 1D | ⎬ WORKING REGISTERS |
| ROW (1) | 02 | 0A | 12 | 1A | 03 | 0B | 13 | 1B | ⎭ |
| ROW (0) | 00 | 08 | 10 | 18 | 01 | 09 | 11 | 19 | |

*FIG. 13*

MICROCONTROLLER HAVING REGISTER DIRECT AND REGISTER INDIRECT ADDRESSING

This application is a Continuation of application Ser. No. 08/752,953, filed Nov. 20, 1996, which is a continuation of Ser. No. 08/543,689, filed Oct. 16, 1995, which is a continuation of Ser. No. 08/196,273, filed Feb. 9, 1994, which is a divisional of Ser. No. 08/015,691, now U.S. Pat. No. 5,473,271, filed Feb. 9, 1993.

BACKGROUND AND SUMMARY OF THE INVENTIONS

The present invention relates to integrated circuit electronic devices, and, more particularly, to microcomputers, microcontrollers, and microprocessors.

Microprocessor Performance

The demand for ever higher performance from computers generally, and microprocessors and microcontrollers in particular, has led to various enhancements including higher clock rates and simpler instruction sets. However, higher clock rates imply less time for instructions including multiple steps which are to be performed in a single machine cycle. In particular, addressing modes such as register indirect addressing still require two memory fetches be made: the first fetch retrieves the contents of the addressing register and the second fetch uses these contents as the address for a data fetch. And two fetches for a single byte instruction will require two machine cycles for the instruction execution unless the machine cycle is fairly long and slow. Thus a problem exists for improving performance of microprocessors and microcontrollers in connection with register indirect addressing.

One approach to multiple step instructions subdivides the clock cycle so that both rising and falling edges of the clock can be used. However, the duty cycle of a clock cannot be relied on as remaining stable as operating conditions such as power supply voltage and temperature vary. Further, use of both rising and falling clock edges only provides a single extra timing edge. A more accurate and flexible partitioning of the clock period to provide more timing edges than just the half period permits use of slower memories with a microcontroller because the portion of the clock period permitted for memory access can be adjusted to accommodate the memory. U.S. Pat. No. 4,893,271 has a phase-locked loop to selectively multiply the crystal oscillator frequency to use as the microprocessor clock and thereby effectively achieve a partitioning of the crystal oscillator period. However, this does not provide a true internal partitioning of the clock period. Thus a problem exists for accurately partitioning the clock period of a microcontroller or microprocessor.

Further problems which arise with higher clock rates for microcontrollers and microprocessors include ringing in output drivers while driving capacitive loads due to the inductance of bond wires. The larger current needed when an output driver must charge up a large load capacitance in a shorter clock period implies overshoot and ringing for a small load capacitance. Thus a problem exists to reduce ringing in output drivers.

Another problem of high performance microprocessors and microcontrollers arises from the recovery time of the crystal oscillator clock following an interrupt-generated restart from a stop mode. A crystal oscillator typically takes a couple of milliseconds to recover and prevents immediate execution of instructions in response to the interrupt.

Microprocessors and microcontrollers typically have a watchdog timer which will generate a system reset signal unless program execution continually resets the watchdog timer. Such a watchdog will permit a system to escape from a lockup condition by the reset. However, some systems do not require a reset circuit, and the watchdog will not be utilized.

Features

The present invention provides microprocessors and microcontrollers with high performance through (1) register indirect addressing through registers which have their contents available on a bus multiplexed to the memory address decoders, (2) clock partitioning through an adjustable delay line with feedback loop control to accurately partition the clock period, (3) multiple stage output drivers for current control, (4) a noncrystal oscillator clock to provide clocking during startup intervals when the crystal oscillator has not yet stabilized, and (5) a watchdog interrupt combined with the watchdog reset to provide uses for the watchdog in systems without resets.

BRIEF DESCRIPTION OF THE DRAWINGS

The present invention will be described with reference to the accompanying drawings.

FIG. 13 shows the organization of the memory of the first preferred embodiment.

DESCRIPTION OF THE PREFERRED EMBODIMENTS

Overall Architecture

Figure 1A:
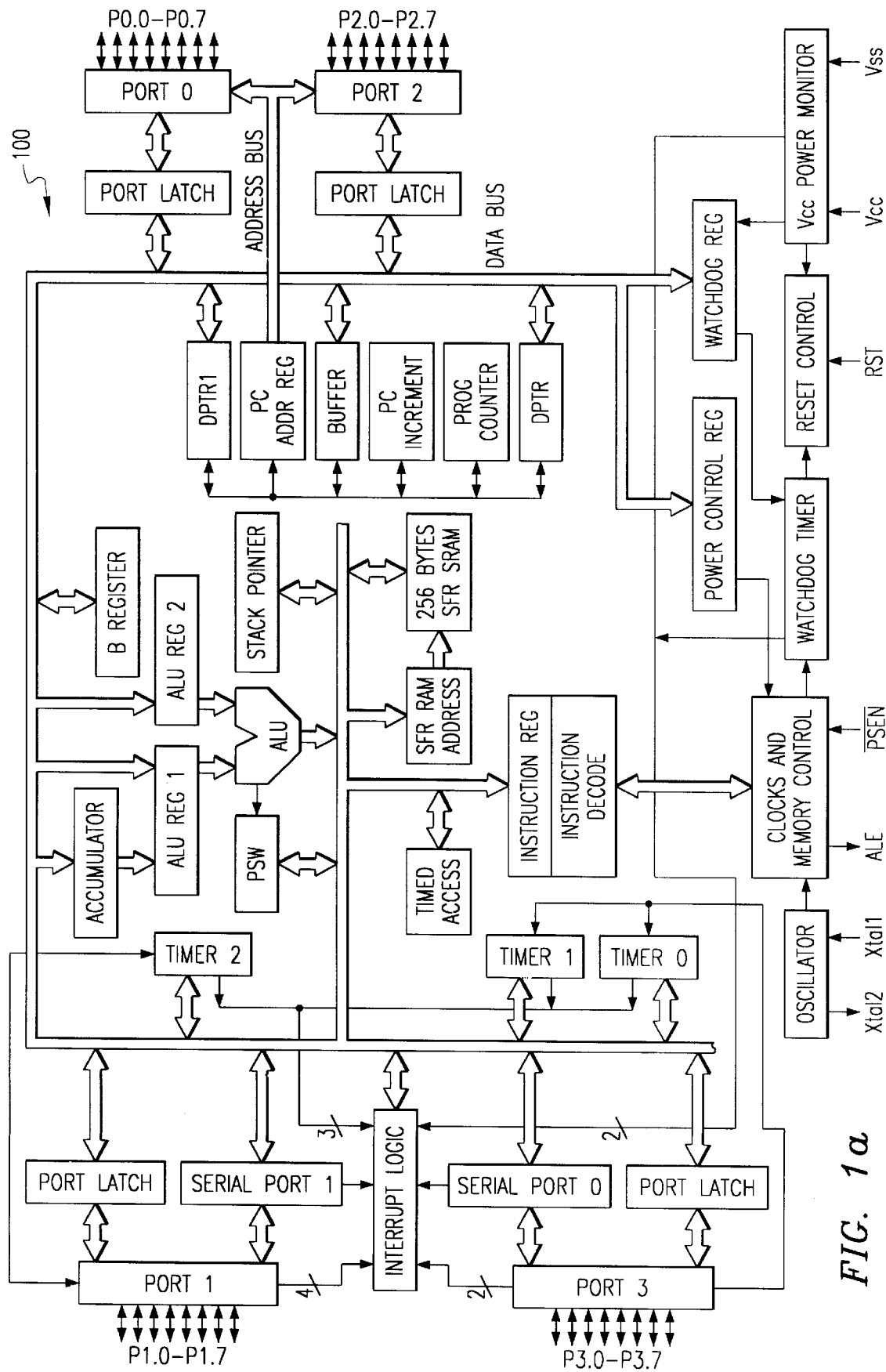
FIGS. 1a–c are block diagrams of a first preferred embodiment microprocessor.

FIG. 1a shows a first preferred embodiment microprocessor, generally denoted by reference numeral 100, in functional block format with the names of the blocks indicating function.

Figure 1B:
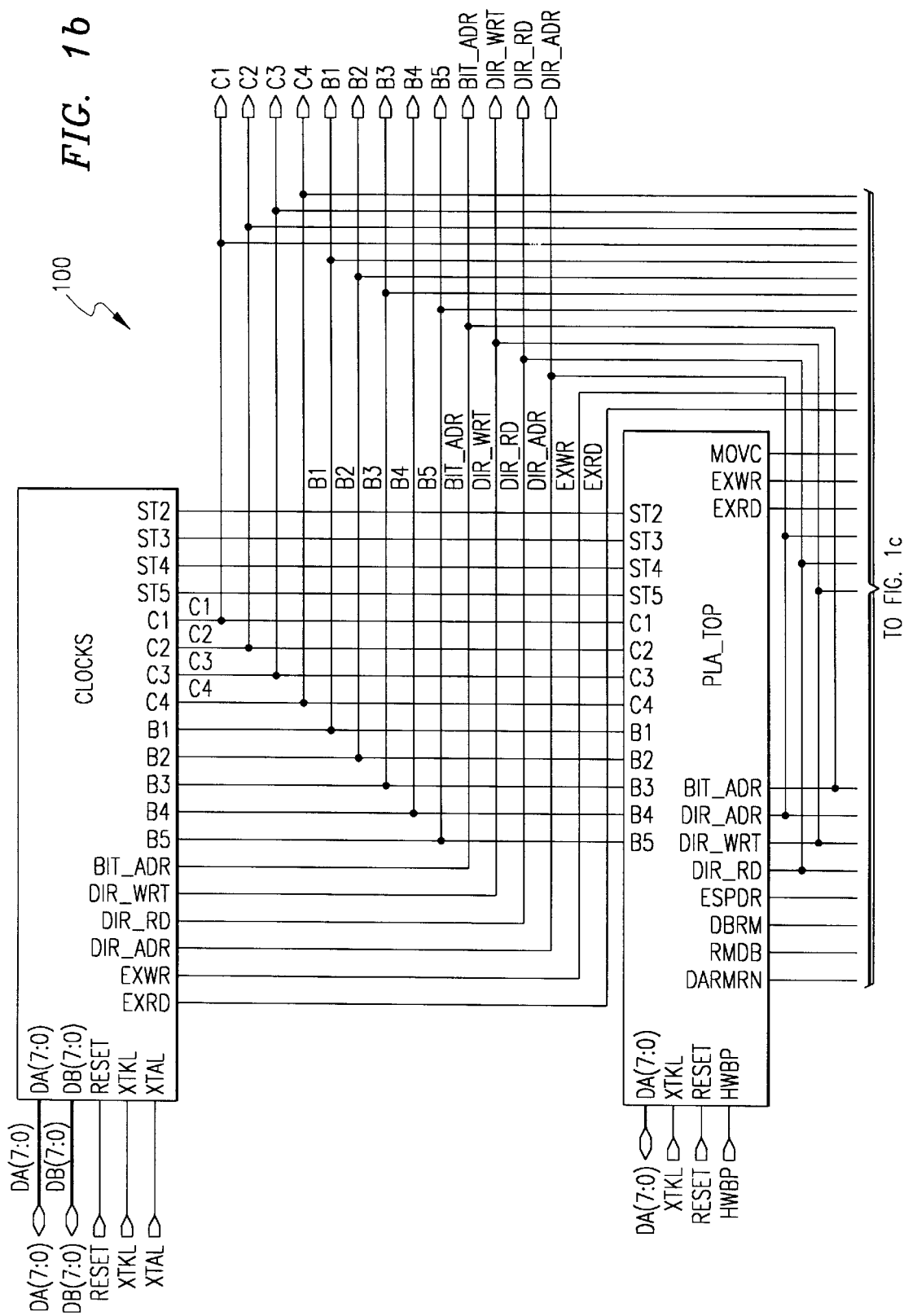
Figure 1C:
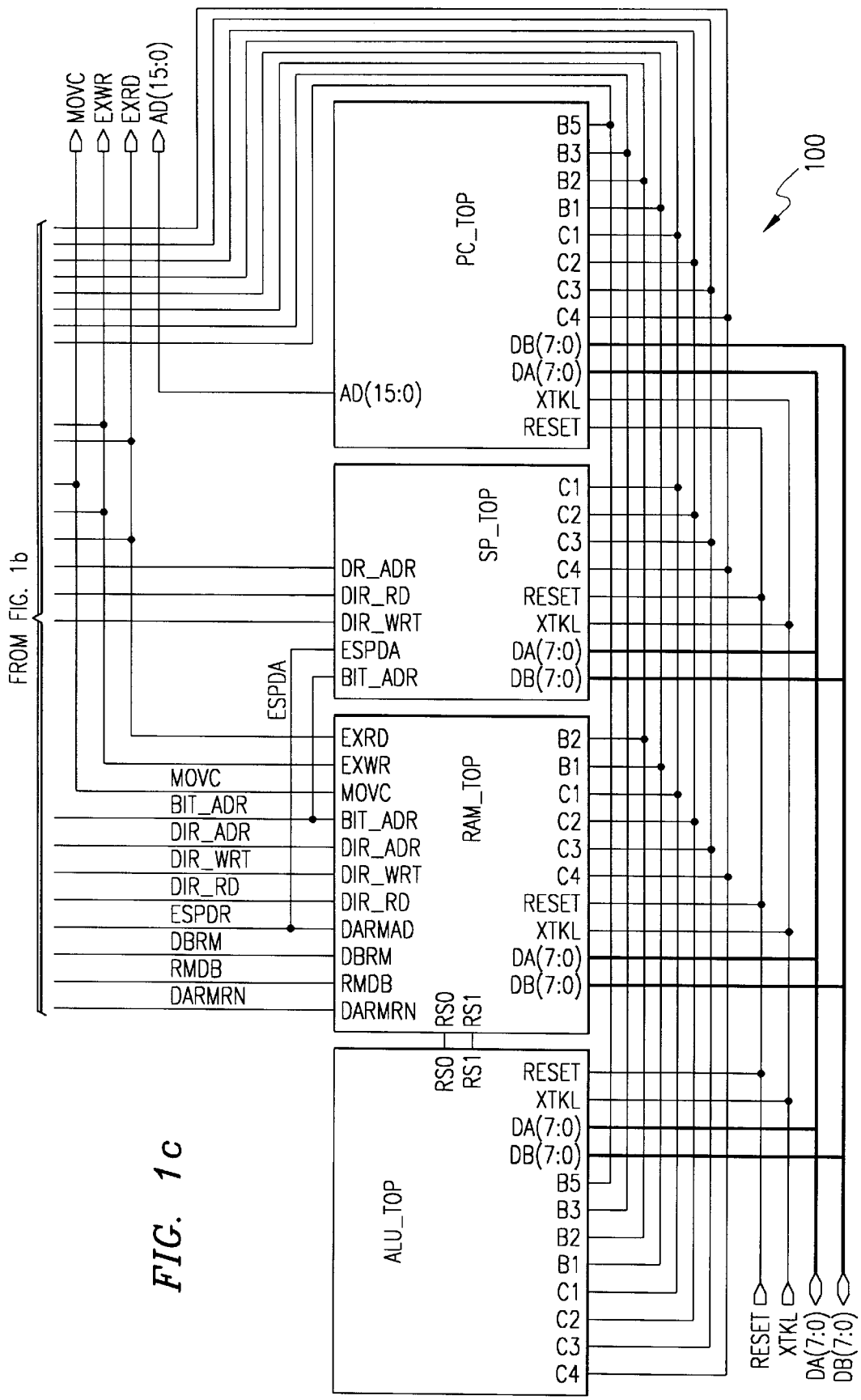

FIGS. 1a and 1b show a portion of embodiment 100 in schematic block form: PLA_TOP which includes the PLA (programmed logic array), PLA decode, instruction register, and PLA timing logic; ALU_TOP which includes the arithmetic logic unit (ALU), accumulator, B register, ALU PLA, Program Status Word, and control logic; CLOCKS which generates the clock signals C1–C4, B1–B5, and ST2–ST5 based on the internal crystal oscillator signal at terminal XTAL; PC_TOP including the program counter; RAM_TOP which includes 256 internal 1-byte (8-bits) registers decoded as 32 rows by 8 columns, the upper 128 registers (addresses 80 through FF) are only addressable by indirect means, and the other 128 registers that are directly addressable are reserved for special function registers; SP_TOP includes the stack pointer with a built-in increment/decrement feature; and various signal lines among the blocks. Some signal lines have been omitted for clarity. The nodes shown in FIGS. 1b and 1c include XTAL (internal crystal oscillator signal), XTKL (oscillator kill signal), DA(7:0) (a bidirectional 8-bit internal data bus), DB(7:0) (another bidirectional 8-bit internal data bus), and AD(15:0) (a 16-bit external address port). Embodiment 100 has instructions that are compatible with the instructions of an Intel 80C32 microcontroller, including various addressing modes: immediate, direct, register, register indirect, register indirect with displacement, and so forth. Some of these addressing modes use the 256 internal registers. The addressing will be considered in more detail below.

Internal Register Organization

Figure 2A:
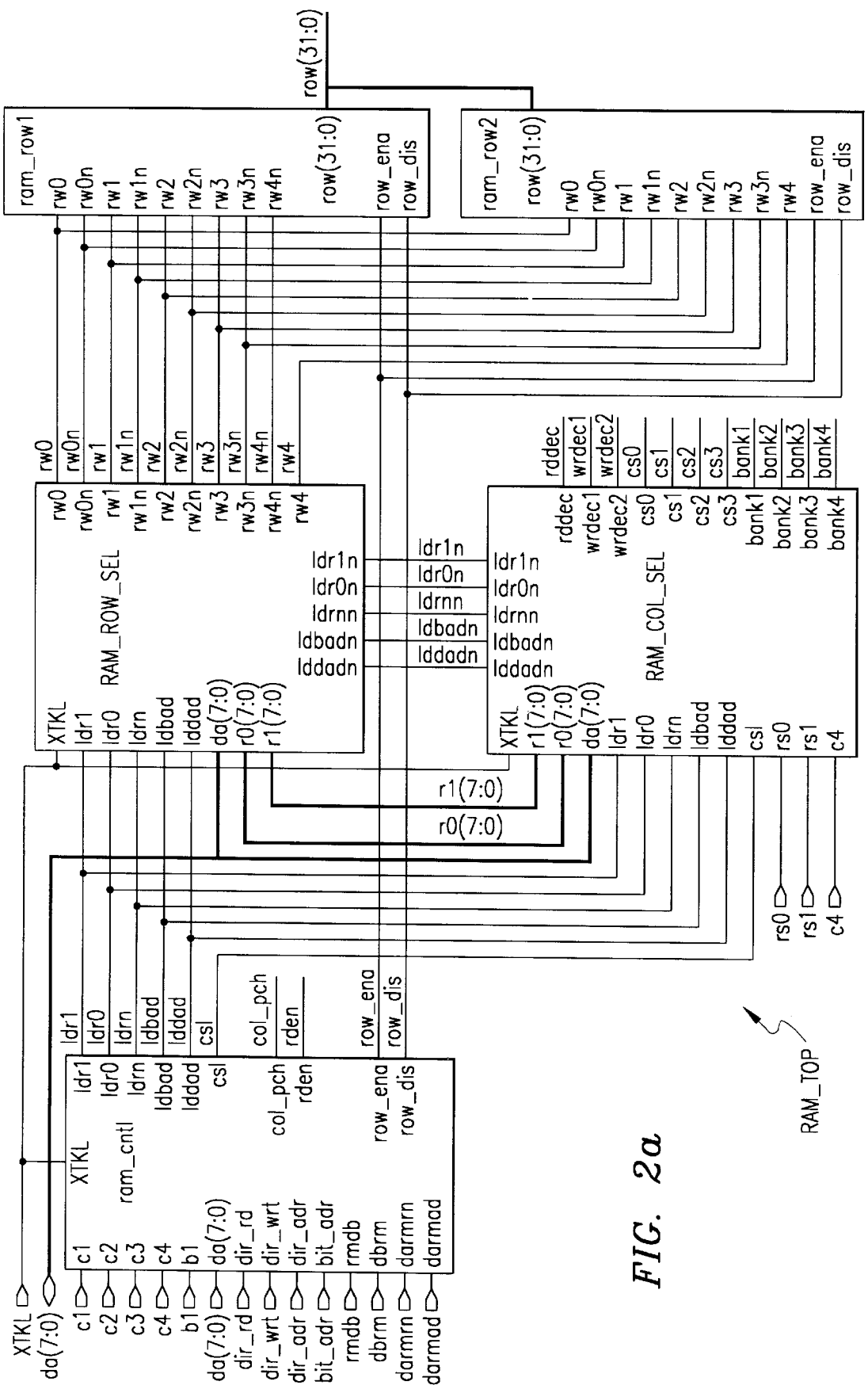
FIGS. 2a and 2b is a structural block diagram of the RAM_TOP block of FIG. 1c.
Figure 2B:
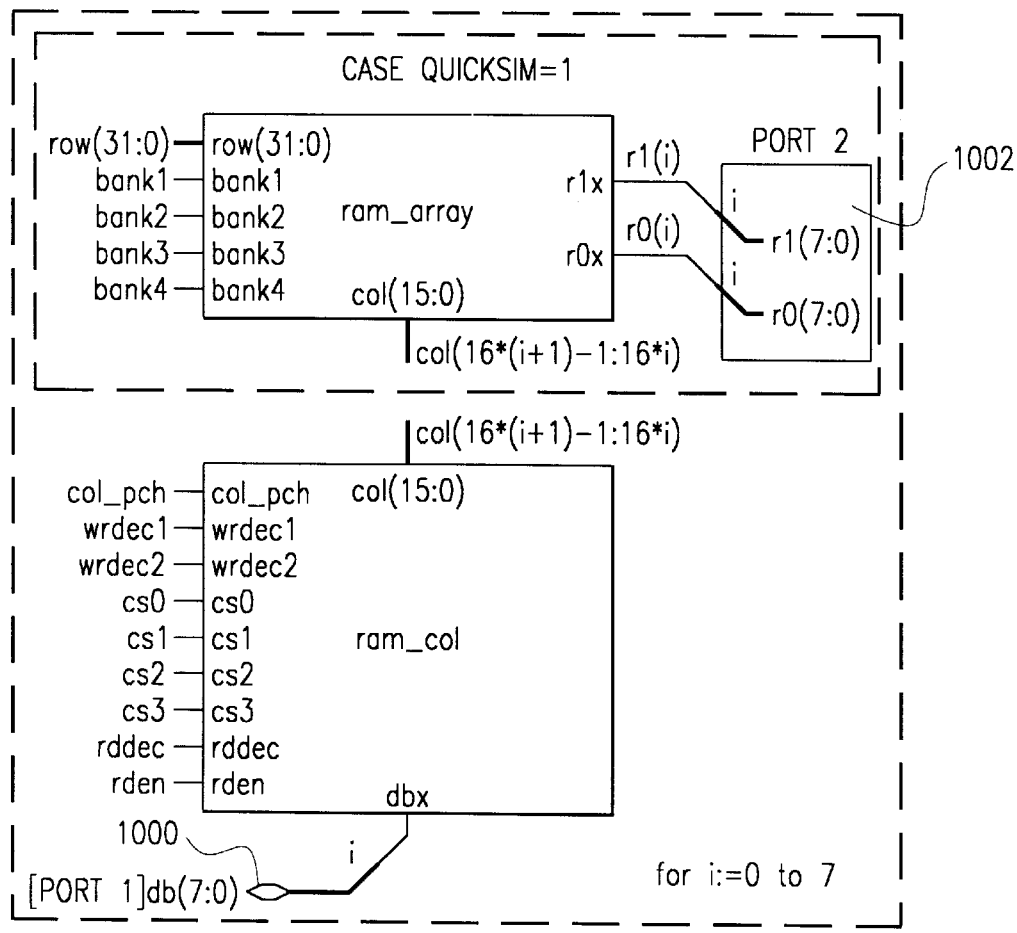

FIG. 2a is a functional block diagram of block RAM_TOP of FIG. 1; block RAM_TOP includes the 256 internal registers and the associated control and address decoding circuitry. The 256 registers are organized as four banks of eight wordings registers each plus 224 other registers. The eight working registers in each bank are labelled R0–R7 with R0 and R1 being used for register indirect addressing. Block RAM_TOP has the following subblocks: RAM_CNTL which is the control block (see FIGS. 3a and 3b), RAM_COL_SEL which is the internal register memory column select (see FIGS. 4a and 4b), RAM_ROW_SEL which is the row select for the internal registers (see FIGS. 5a and 5b), RAM_ROW1 and RAM_ROW2 which are register memory row address decoders (see FIGS. 6a–b), and eight copies of the pair of subblocks RAM_ARRAY and RAM_COL with each copy corresponding to one of the eight bits in a byte (see FIGS. 7a, 8, 9a and 9b). Note that the 256 internal registers occupy 2K bits which are organized as 32 rows by 8 columns of 8 bits; thus the row address of a register is one of 32 possible (5 bits) and the column address of the register is one of 8 possible (3 bits).

Figure 3A:
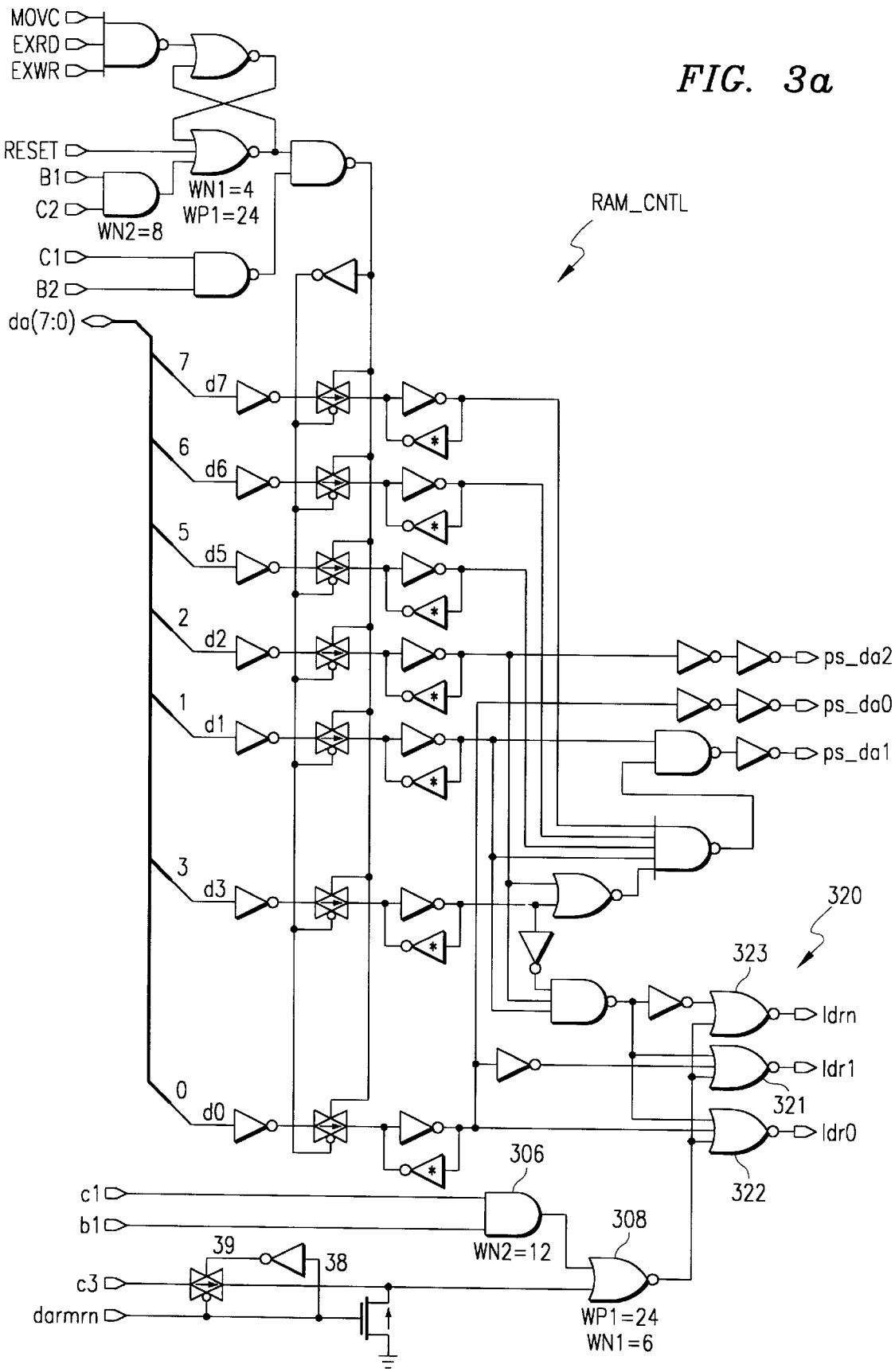
FIGS. 3a, 3b, 4a, 4b, 5a, 5b, 6a, 6b, 7a, 7b, 8, 9a and 9b are schematic circuit diagrams of the subblocks of FIGS. 2a and 2b.
Figure 3B:
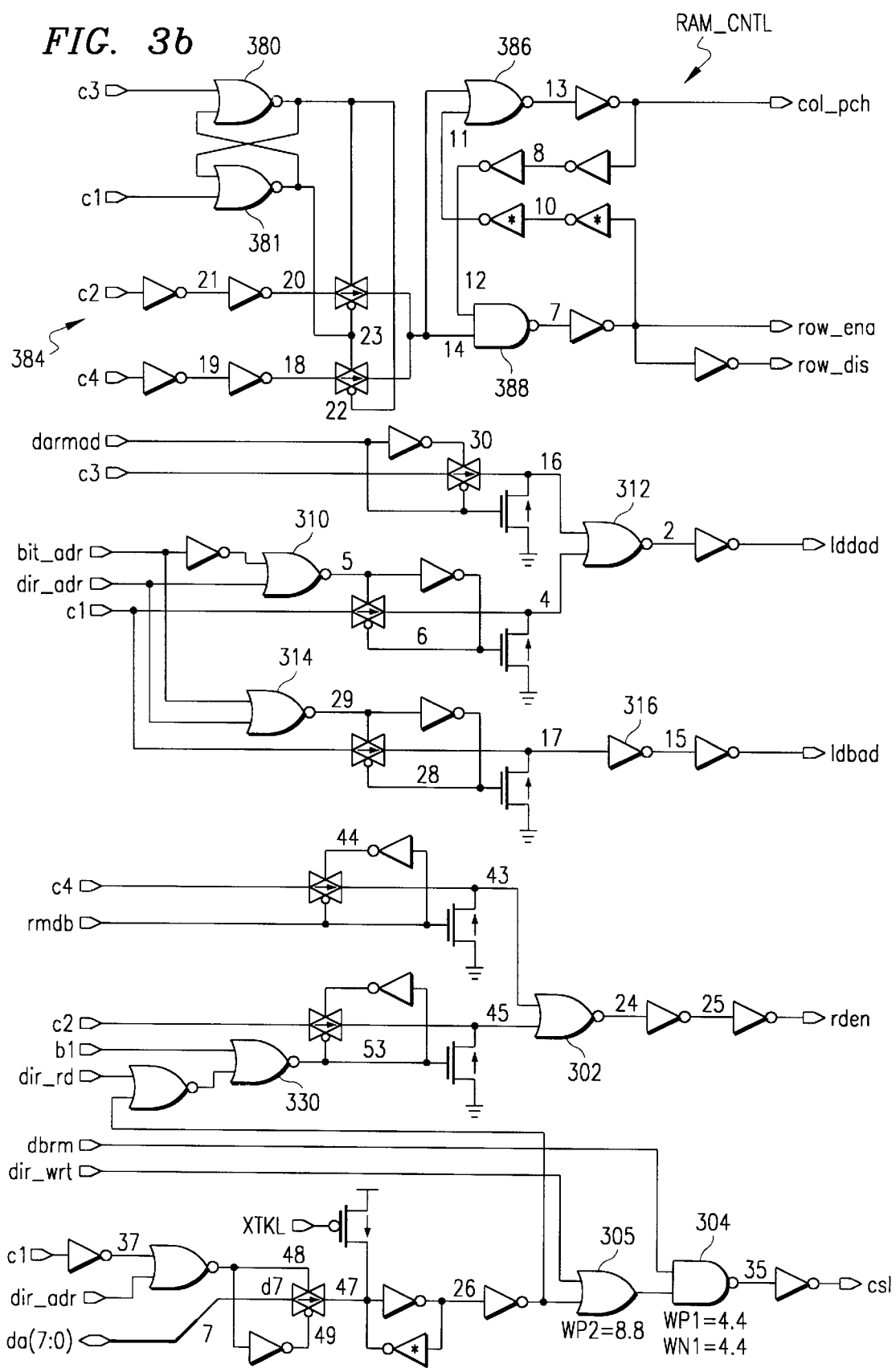
Figure 4A:
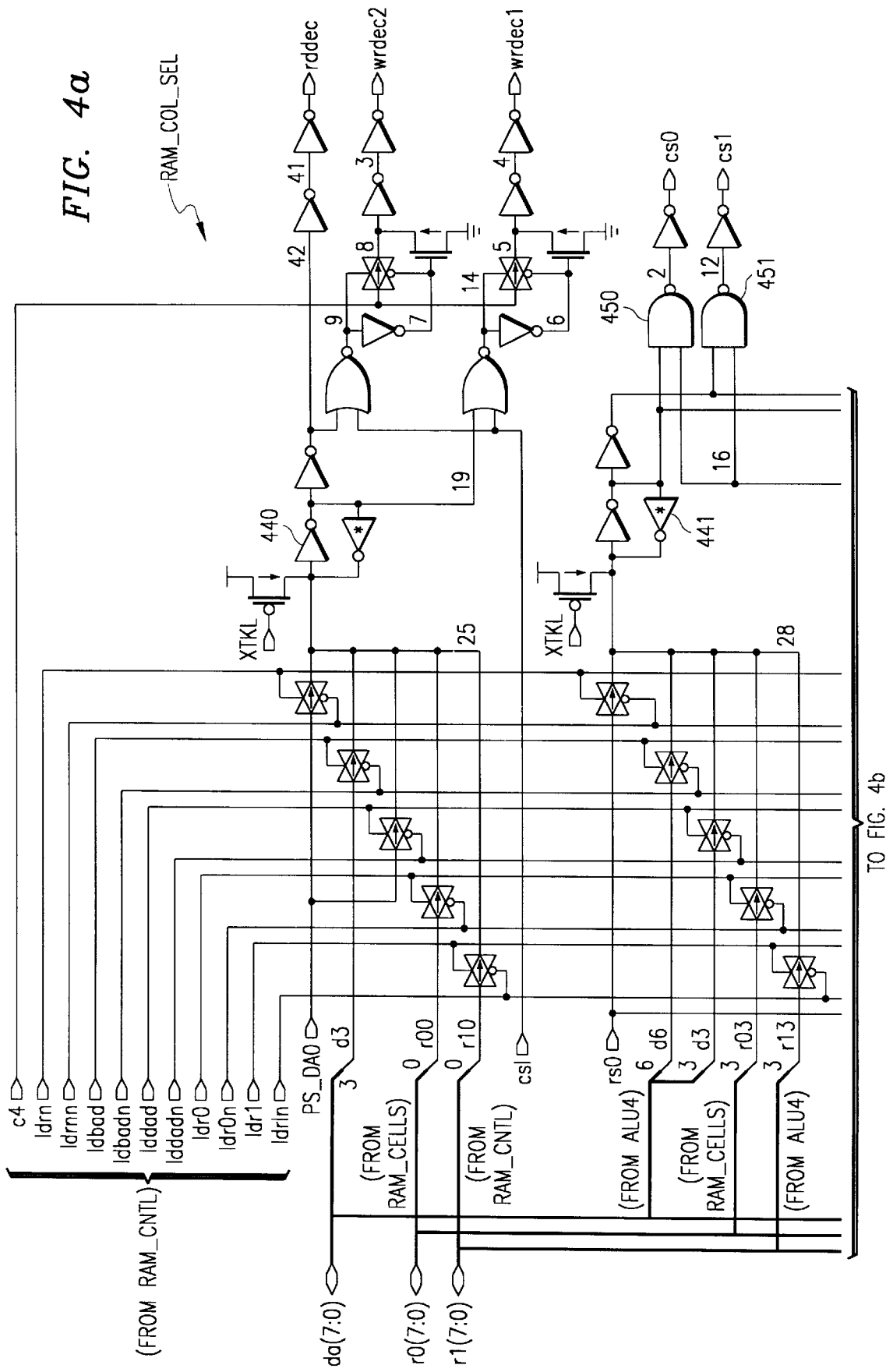
Figure 4B:
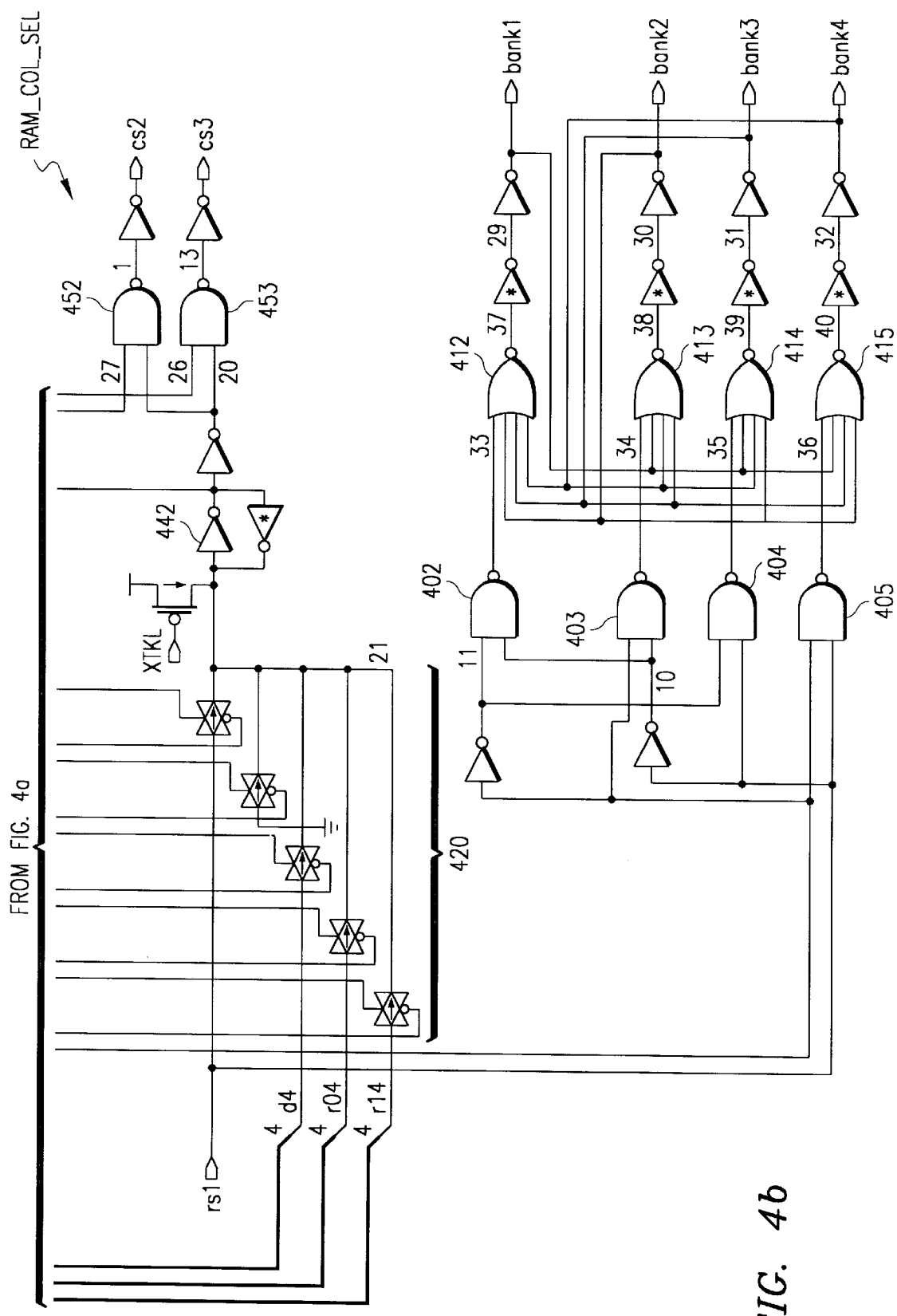
Figure 5A:
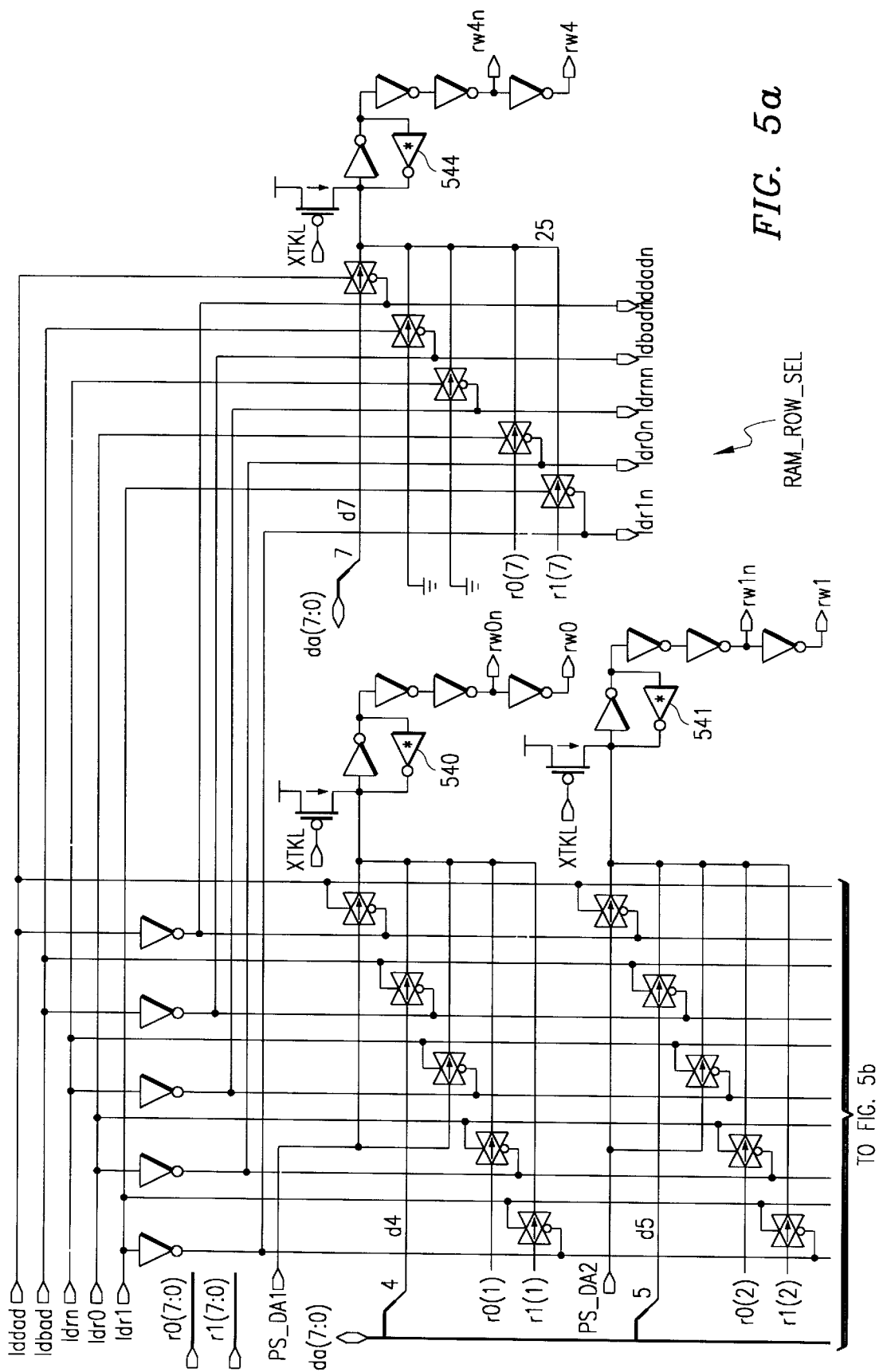
Figure 5B:
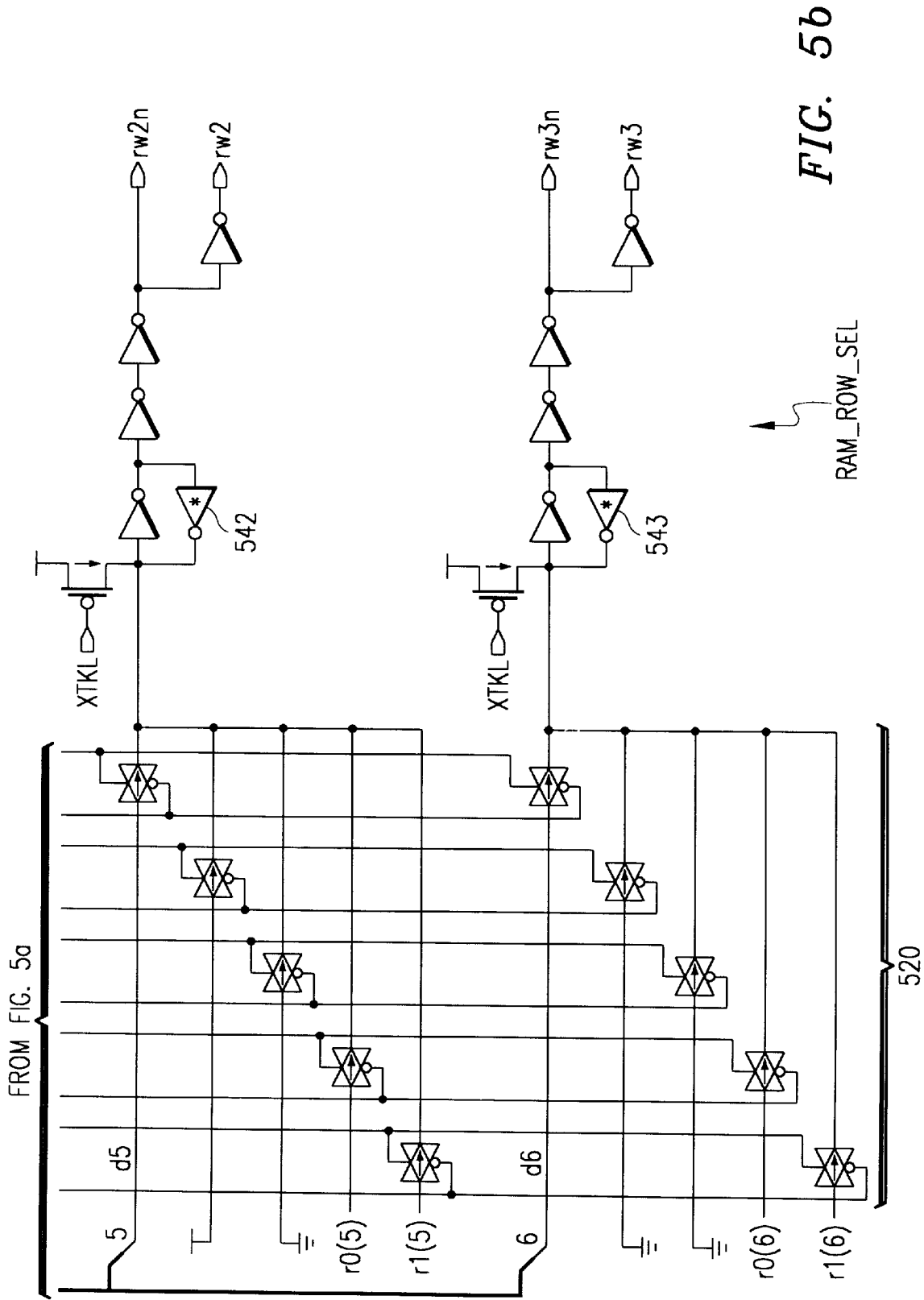
Figure 6A:
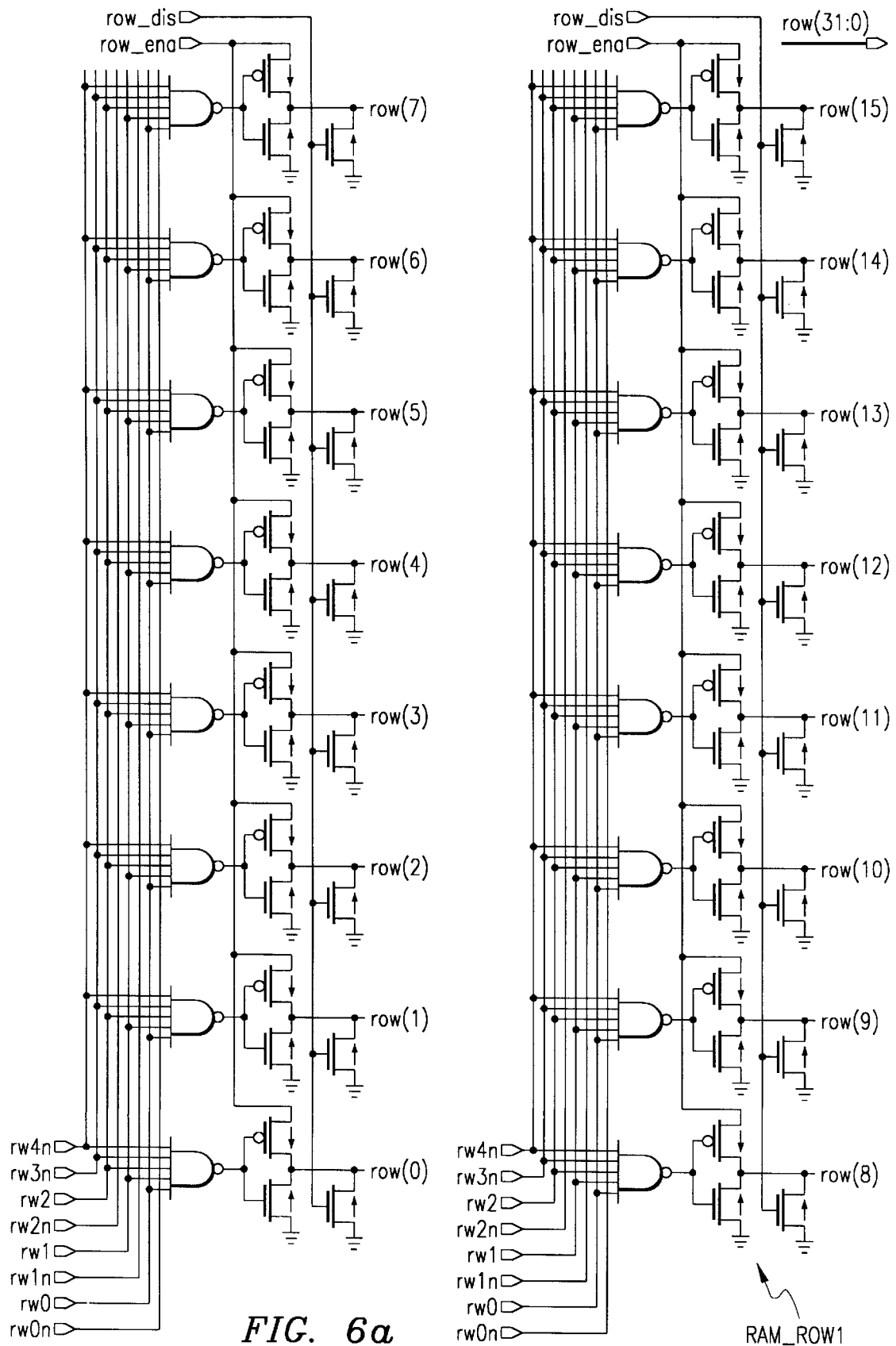
Figure 6B:
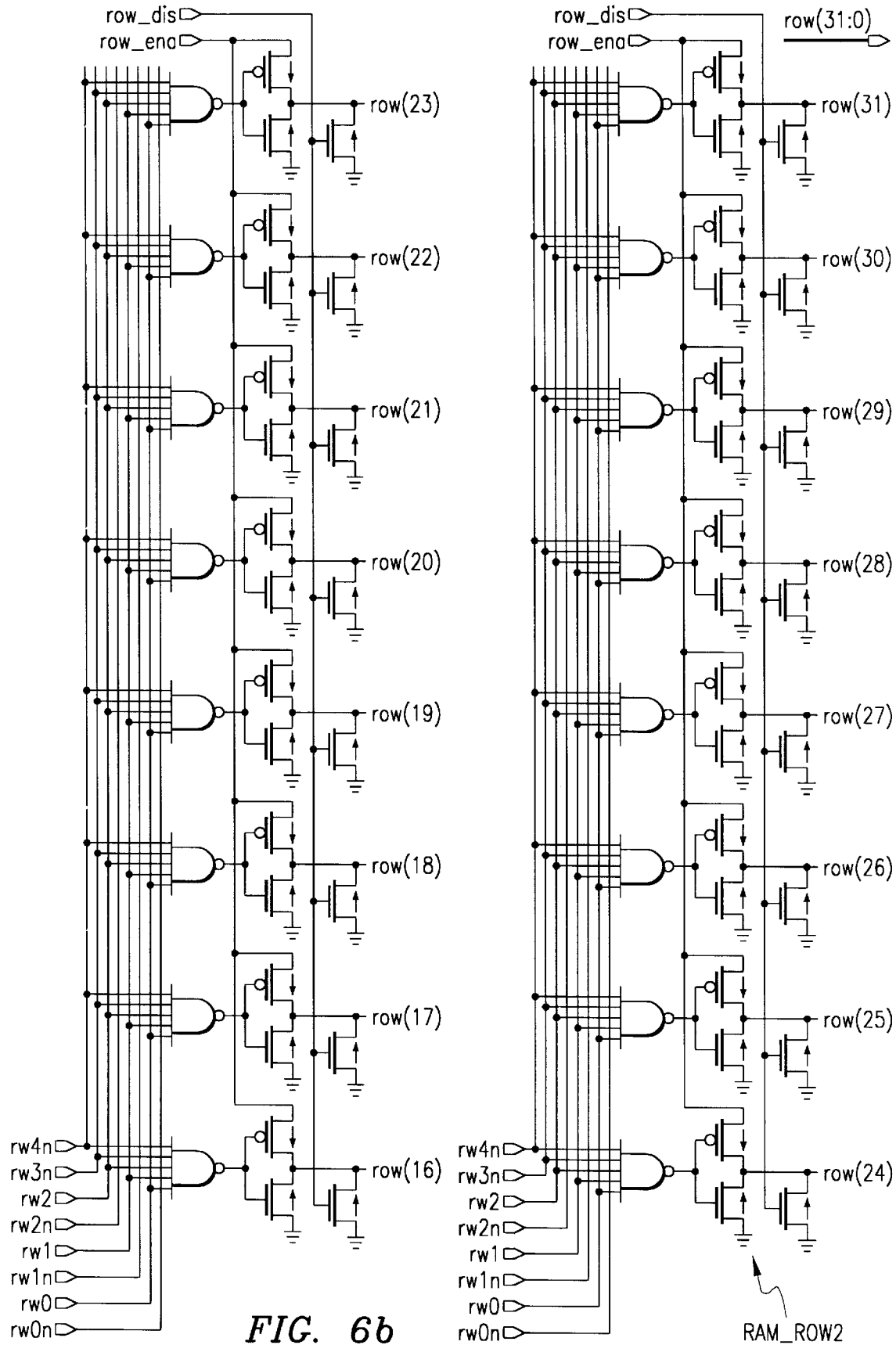
Figure 7A:
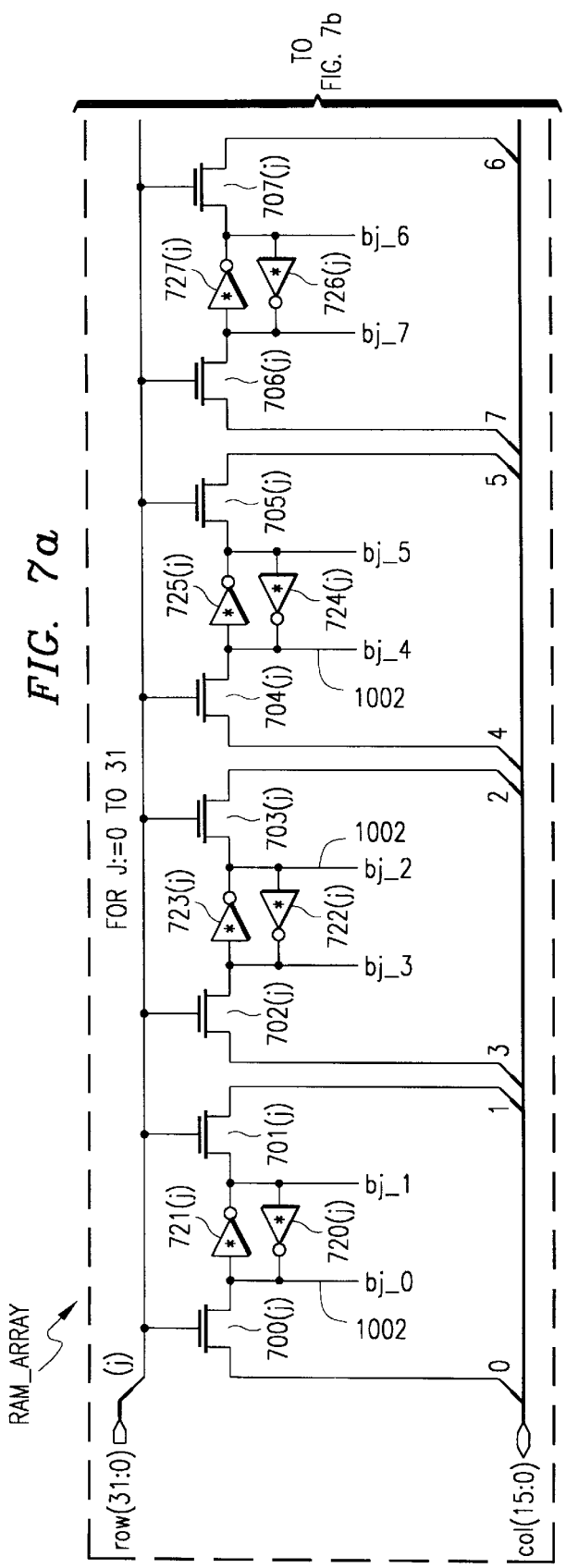
Figure 8:
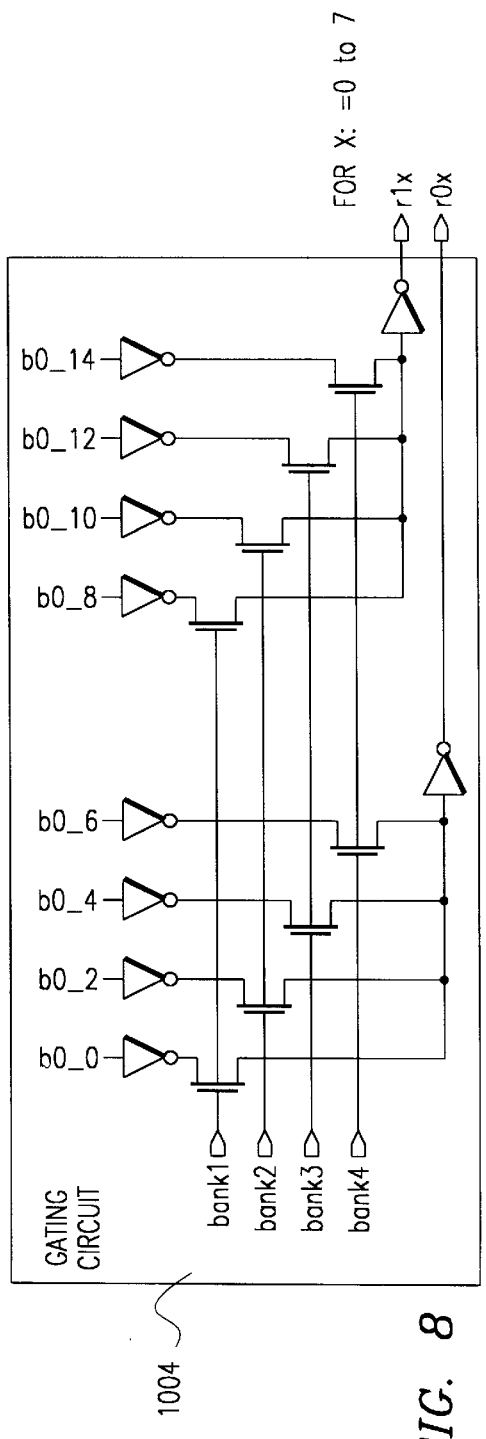
Figure 9A:
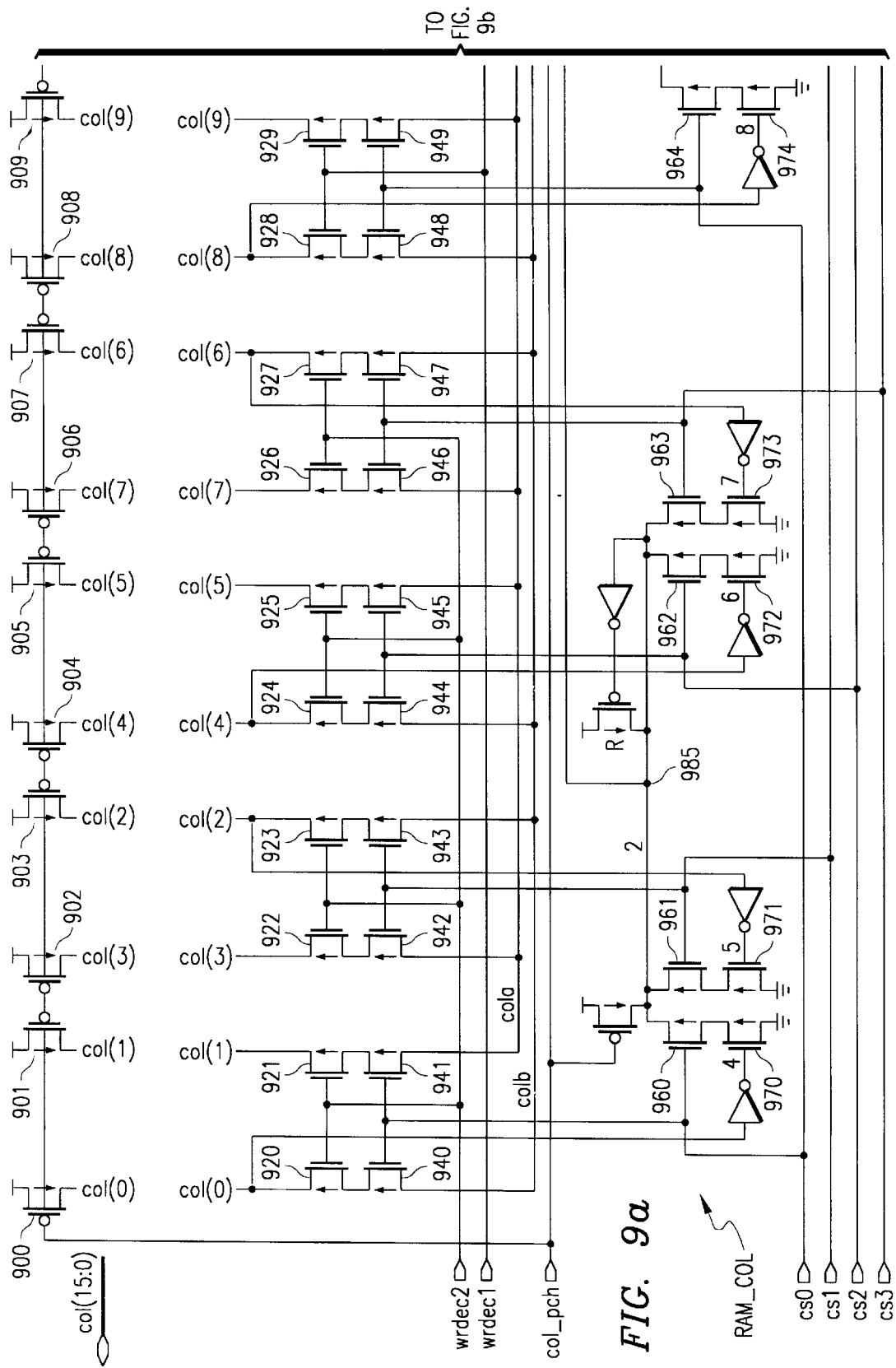
Figure 9B:
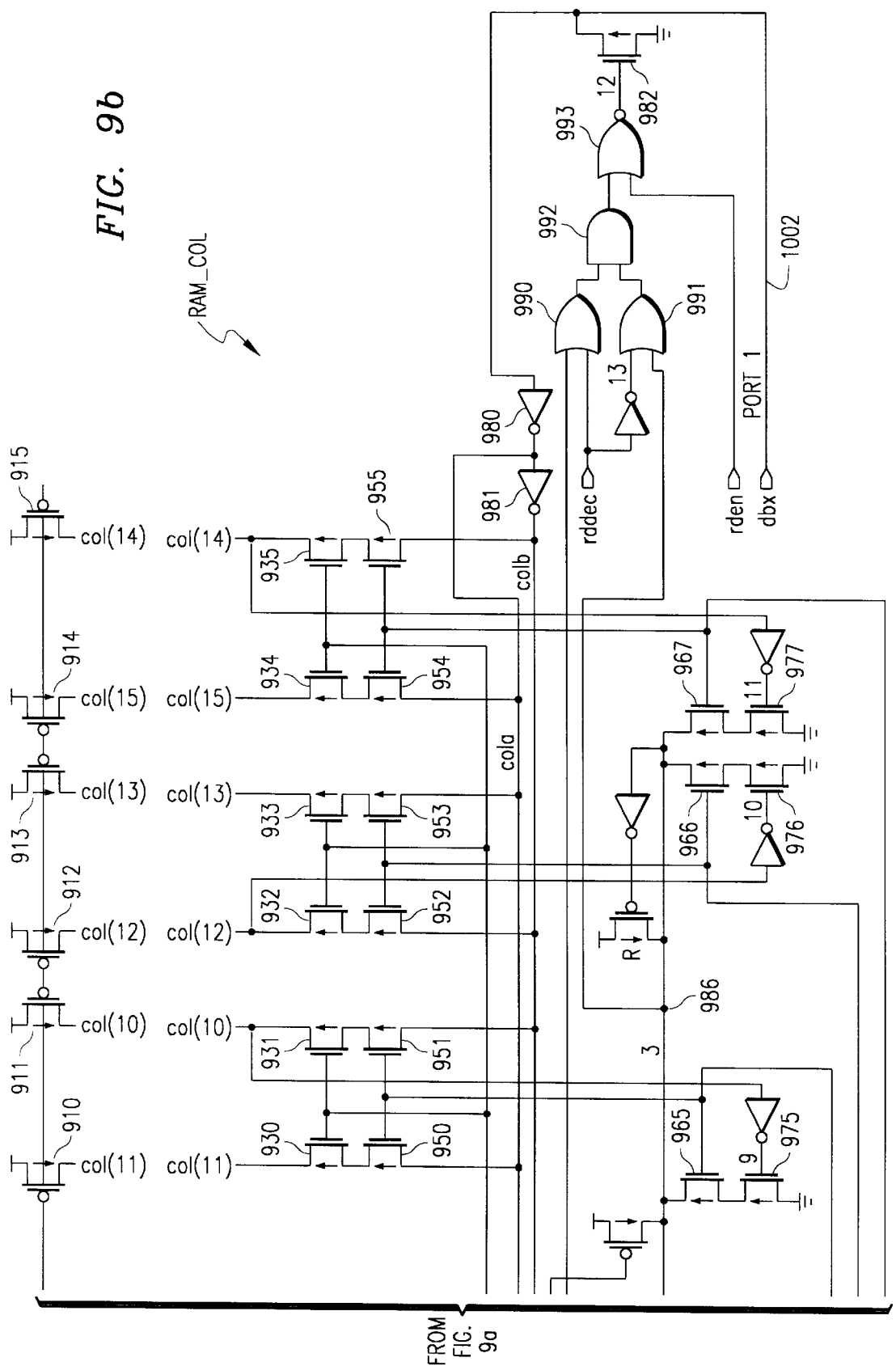

FIGS. 3a–b form a schematic diagram of subblock RAM_CNTL; FIGS. 4a and 4b are a schematic diagram of subblock RAM_COL_SEL; FIGS. 5a and 5b are a schematic diagram of subblock RAM_ROW_SEL; FIGS. 6a–b are schematic diagrams of subblocks RAM_ROW1 and RAM_ROW2, respectively; FIGS. 7a and 8 are schematic diagrams for subblock RAM_ARRAY; and FIGS. 9a and 9b are schematic diagram of subblock RAM_COL. The particular structure of the block RAM_TOP provides efficient register indirect addressing, and this will be described after a review of some prior art addressing.

Figure 10:
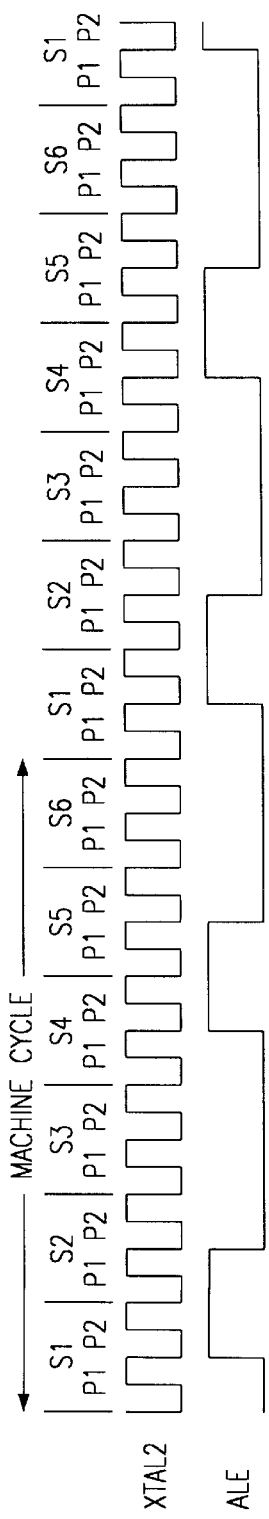
FIG. 10 is a prior art timing diagram illustrating instruction execution.

First consider FIG. 10 which is a timing diagram for some of the addressing methods of instructions of the DS5000 microcontroller (an Intel 8051 type microcontroller manufactured by Dallas Semiconductor Corp.). The various instructions can be classified by the number of bytes of instruction and the number of machine cycles required to execute the instruction. For example, the instructions INC A and DEC A are both 1-byte, 1-cycle instructions. In particular, INC A is encoded as 0000 0100 (one byte) and execution of INC A increments the contents of the accumulator by 1 in one machine cycle. Similarly, DEC A is encoded as 0001 0100 and execution decrements the accumulator contents by 1 in one machine cycle. Other 1-byte, 1-cycle instructions include ADD A,Rn which adds the contents of working register Rn (R0–R7 are the eight working registers in each of four banks of scratchpad memory) to the contents of the accumulator and puts the sum in the accumulator. This instruction is encoded as 0010 1ijk where ijk is the binary version of n (0–7) and uses register addressing. Instructions such as MOV A,Rn and XCH A,Rn are similar uses of register addressing and also 1-byte, 1-cycle instructions.

Instructions such as ADD A,Direct, MOV Direct,A, INC Direct, and ADD A,Data are 2-byte, 1-cycle instructions. In particular, ADD A,Data is encoded as 0010 0100, $d_7d_6d_5d_4d_3d_2d_1d_0$, and execution of ADD A,Data adds the byte $d_7d_6d_5d_4d_3d_2d_1d_0$ to the contents of the accumulator and puts the sum in the accumulator. Thus ADD A,Data uses immediate addressing.

Conversely, instructions such as MOVX A,@DPTR, which puts the contents of the byte of external memory with 16-bit address contained in 16-bit register DPTR into the accumulator, are 1-byte, 2-cycle instructions.

Other instructions may have even more bytes or require more machine cycles; for example, MOV Direct,Direct and XRL Direct,Data are 3-byte, 2-cycle instructions: three bytes are needed because the direct address (one of the 256 internal registers) is a byte, the data is a byte, and the opcode is a byte.

Register Indirect Addressing

As FIG. 10 shows, one machine cycle for the DS5000 includes enough time to read two instruction bytes (intervals S1 and S4). This is shown as ALE (address latch enable) going high twice per cycle. For register indirect addressing instructions such as ADD A,@Rj and MOV A,@Rj, which are 1-byte, 1-cycle instructions, both of these two reads in one cycle are necessary. In particular, execution of MOV A,@Rj puts into the accumulator the data byte contained in the register with address contained in register Rj. For example, if register R0 has contents 0011 1001 (37 Hex) then the data byte to be moved into the accumulator is contained in the register with address 0011 1001; that is register R37. Thus for execution of MOV A,@R0 first the contents of register R0 must be accessed (S1 read points to R0), and then these contents are used as an address (in S4 read) to access the contents of register 37 to be put into the accumulator. The instruction MOV A,@Rj is encoded as 1110 011j and thus only the R0 and R1 scratchpad registers can be used to hold the address because j is either 0 or 1; but there is an R0 and an R1 scratchpad register in each of the four banks.

In preferred embodiment 100 each machine cycle has only four subintervals C114 C4, rather than the six subintervals S1–S6 shown in FIG. 10, and only time for one read per cycle. Thus for instructions such as MOV A,@Rj and ADD @R0,A (which use register indirect addressing) to remain as 1-byte, 1-cycle instructions in preferred embodiment 100, RAM_TOP needs quicker access to the contents of the R0 and R1 registers to avoid requiring two cycles for two reads. The register structure of FIGS. 2a–9b provides this quicker access to the contents of R0 and R1. The following discussion will first consider direct addressing and register addressing for RAM_TOP, and then will describe register indirect addressing with the quick access to registers R0–R1.

First consider an instruction such as MOV Direct,A which uses direct addressing and puts the contents of the Accumulator into the Register which has the address Direct. As an example, take Direct equal to the byte 0010 0000 (=20 in Hexadecimal) and the contents of the Accumulator equal to the byte 0101 0101 (55 Hex), so MOV 20,A is to put the byte 55 into the Register which has address 20; that is, into register R20. Recall that the 256 Registers have 1-byte contents and 1-byte addresses with the 32 low address Registers (Hex addresses 00 through 1F) constituting the working Registers which are divided into four banks of eight Registers each (bank 1 with address 00–07, bank 2 with addresses 08–0F, bank 3 with addresses 10–17, and bank 4 with addresses 18–1F). Thus the Register R20 is the lowest addressed Register outside of the working Registers.

Figure 11:
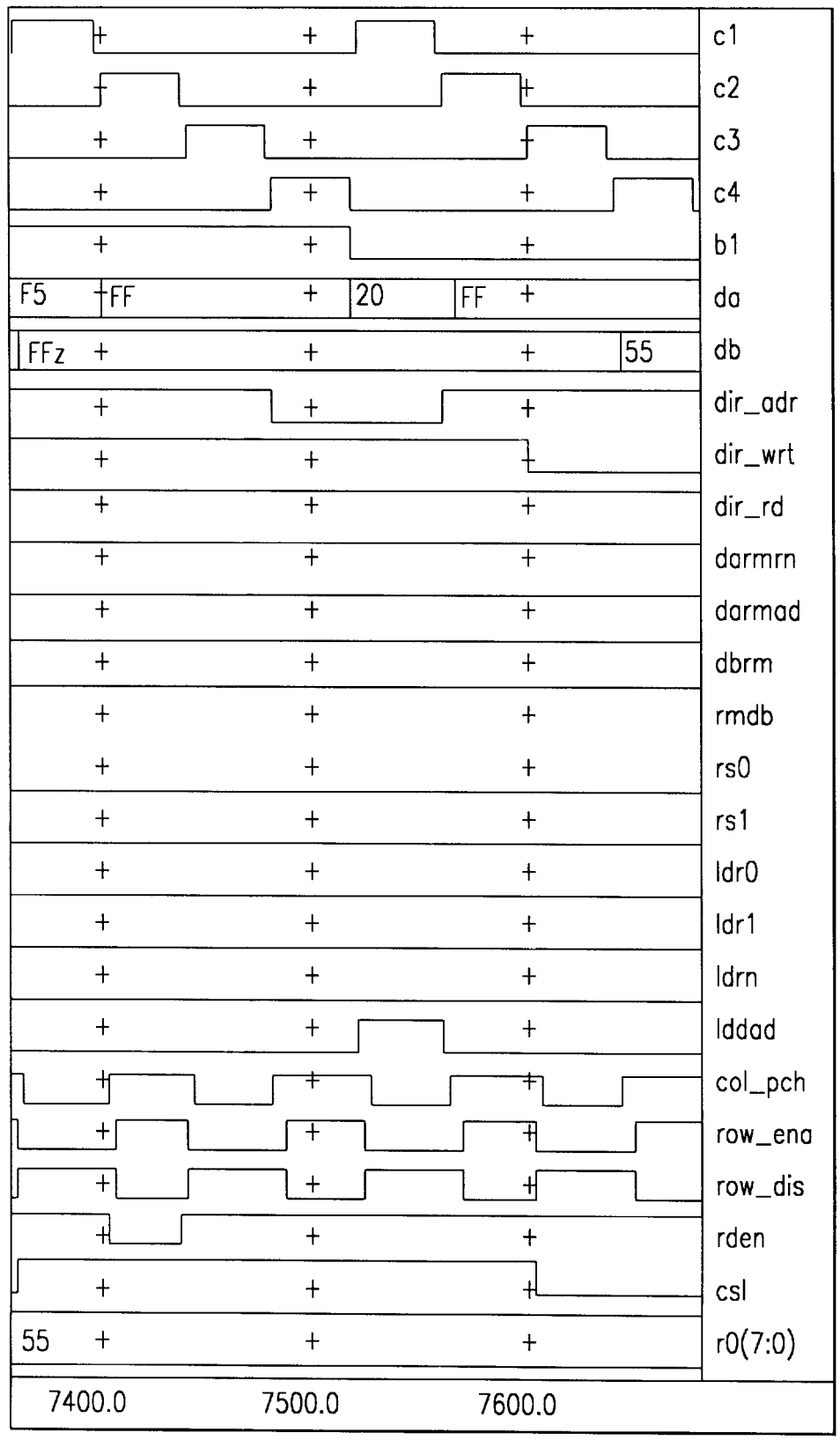

FIG. 11 is a timing diagram showing the execution of the 2-byte instruction MOV 20,A. The top four panels in FIG. 11 indicate the four nonoverlapping subintervals C1–C4 of each machine cycle, and the fifth panel shows B1 high which indicates the first machine cycle of an instruction and and then low which indicates the second machine cycle. At the first subinterval C1B1, the opcode (F5 in Hex) of the instruction is present on data bus DA(7:0) as shown in the sixth panel. The seventh panel shows the status of the data bus DB(7:0) as initially pulled up. Panels eight through ten show the signals on the direct read, write, and address lines DIR_RD, DIR_WRT, and DIR ADR, respectively; and panels eleven through fourteen show the signals on lines DARMRN, DARMAD, DBRM, and RMDB which have the following meanings: RMDB is a PLA_TOP output and is active during register type addressing (e.g., Rn or @Ri) and forces data from a register in RAM onto data bus DB(7:0) via port 1 1002 (FIG. 2b) during a C2 subinterval of a particular machine cycle; DBRM is also a PLA_TOP output and is active during register type addressing and is used to force data from data bus DB(7:0) into a register located in RAM via port 1 (1002) (FIG. 2b) that was addressed directly (e.g., MOV Rn,A) or indirectly (e.g., MOV @Ri,A); DARMRN is a PLA_TOP output that is active during indirect addressing at a time other than the C1 subinterval of the first machine cycle where this is done automatically with the signal timing active from the C4 subinterval of one machine cycle to the C1 subinterval of the following machine cycle of the same instruction; and DARMAD is a PLA_TOP output that loads an address from data bus DA(7:0) into the RAM address decode logic and is active only when the address is obtained from the stack pointer. FIG. 11 panels fifteen and sixteen show the bank select signals RS0 and RS 1; panels seventeen through twenty illustrate the signals on the load Register Rn, load Register R0, load Register R1, and load direct address register lines LDRN, LDR0, LDR1, and LADDAD, respectively. Panels twenty-one through twenty-five illustrate signals for the rows and columns for addressing the registers, and the last panel shows the bus R0(7:0) which connects to the R0 registers.

During the first C1 high subinterval the opcode of the instruction MOV 20,A is decoded in block PLA_TOP (see FIG. 1b) which outputs to RAM_TOP (FIG. 2) the following for a direct address instruction:

| Input | Status |
| --- | --- |
| DA(7:0) | F5 (opcode) |
| C1 | High |

-continued

| Input | Status |
| --- | --- |
| C2 | Low |
| C3 | Low |
| C4 | Low |
| B1 | High |
| DIR_RD | High |
| DIR_WRT | High |
| DIR_ADR | High |
| BIT_ADR | High |
| RMDB | High |
| DBRM | High |
| DARMRN | High |
| DARMAD | High |

Because MOV 20,A is a 2-byte instruction, the direct address of the target register R20 cannot be decoded until the next C 1. But the DIR_ADR signal is activated (goes low) at the first C4 subinterval because a direct register address is to come on DA(7:0) during the next C1. Thus the inputs to RAM_TOP during this first C4 are as follows:

| Input | Status |
| --- | --- |
| DA(7:0) | High impedance |
| C1 | Low |
| C2 | Low |
| C3 | Low |
| C4 | High |
| B1 | High |
| DIR_RD | High |
| DIR_WRT | High |
| DIR_ADR | Low (active) |
| BIT_ADR | High |
| RMDB | High |
| DBRM | High |
| DARMRN | High |
| DARMAD | High |
| RS0 | Low (Bank1 code from ALU) |
| RS1 | Low (Bank1 code from ALU) |

Note that the DIR_RD line would be low (active) if a direct read were coming, DIR_WRT would be low (active) if a direct write were coming, BIT_ADR would be low (active) if a particular bit of a Register were to be accessed, RS0 and RS 1 are both low to select Bank1 (see FIG. 4). In particular, block ALU_TOP generates the selection of one of the four banks of working Registers with the signals RS0 and RS1 in FIGS. 1c, 2a and 4a and 4b. As shown by FIGS. 4a and 4b the signals RS0 and RS1 are decoded by NAND gates 402–405 and the four outputs Bank1–Bank4 are nonoverlapping and held in NOR gates 412–415 by feedback.

During the second C1 subinterval the second byte of the instruction (the Hex byte 20) is put on the bus DA(7:0) by the block PLA_TOP, and the direct address line DIR_ADR remains low. Thus the inputs to the subblock RAM_CNTL are (on the left hand edge of FIGS. 3a and 3b):

| Node | Status |
| --- | --- |
| C4 | Low |
| RMDB | High (write) |
| C2 | Low |
| DIR_RD | High (inactive) |
| DBRM | High |
| DIR_WRT | High (inactive) |
| C1 | High |

-continued

| Node | Status |
| --- | --- |
| B1 | Low |
| C3 | Low |
| DARMRN | High |
| DA(7:0) | 0010 0000 (20 Hex) |
| DARMAD | High |
| BIT_ADR | High (inactive) |
| DIR#ADR | Low (active) |

Thus the RDEN (read enable) output is high because both inputs to NOR gate 302 are low; the output CSL is high because the DBRM input to NAND gate 304 is high and the DIR_WRT input to OR gate 305 also is high; LDR1, LDR0, and LDRN are all low due to the high output of NOR 308 which has inputs C3 (low) and AND gate 306 (low) due to inputs B1 (low) and C1 (high). LDDAD is high due to DIR_ADR low and BIT_ADR high which has NOR gate 310 high and thus passing C1 (high) to NOR gate 312. LDBAD is low due to the high BIT_ADR driving NOR gate 314 low and thus pulling down the input to inverter 316.

Figure 12:
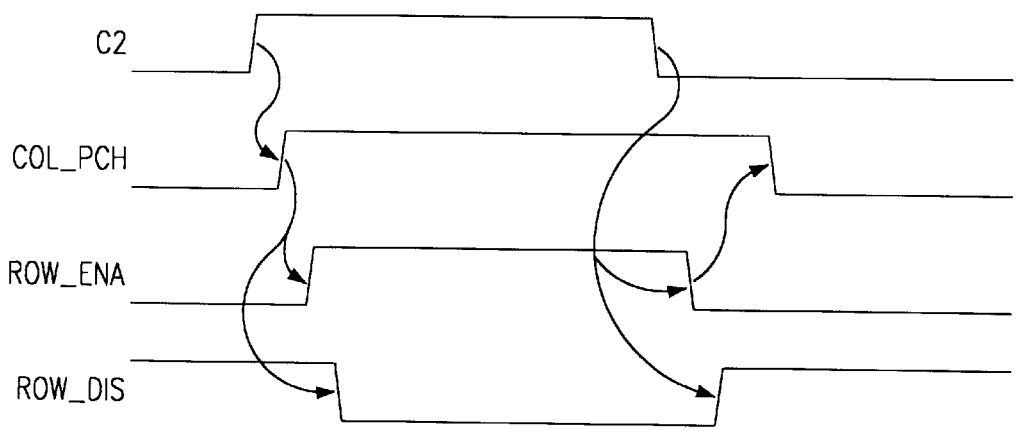
FIGS. 11–12 and 14–15 are timing diagrams for instruction execution of the first preferred embodiment.

FIG. 12 illustrates the signals COL_PCH (column precharge), ROW_ENA (row enable), and ROW_DIS (row disable) generated from C1–C4 in RAM_CNTL (see the righthand portion of FIGS. 3a and 3b); FIG. 11 also illustrates these signals but not with as much timing detail. For C1 high and C2–C4 low, NOR gate 380 is low and NOR gate 381 is high, thus transmission gates 384 passes C2 (which is low) to NOR gate 386 and NAND gate 388. Hence, NAND gate 388 is high, and thence NOR gate 386 is also high. This implies COL_PCH is low, ROW_ENA is also low, and ROW_DIS is high. Now when C1 goes low and C2 goes high, the latch formed by NOR gates 380–381 does not change state and the high C2 pases transmission gates 384 to drive NOR gate 386 low and thence NAND gate 388 low. Thus COL_PCH and ROW_ENA switch high and ROW_DIS switches low. Next, when C2 goes low and C3 goes high, the 380–381 latch changes state to pass C4 rather than C2 (both are low) to NOR gate 386 and NAND gate 388. Thus COL_PCH and ROW_ENA both switch back low, and ROW_DIS switches back high. Lastly, when C3 goes low and C4 goes high, latch 380–381 retains its state, but COL_PCH and ROW_ENA again switch high and ROW_DIS returns low. In summary:

| High Subinterval | COL_PCH | ROW_ENA | ROW_DIS |
| --- | --- | --- | --- |
| C1 | 0 | 0 | 1 |
| C2 | 1 | 1 | 0 |
| C3 | 0 | 0 | 1 |
| C4 | 1 | 1 | 0 |

Twice each machine cycle (C2 and C4) the row decoders are active as shown in FIG. 11. Note that because the low-to-high transition of ROW_ENA follows the low-to-high transition of COL_PCH by the propagation delay through three inverters and a NAND gate and because the high-to-low transition of COL_PCH follows the high-to-low transition of ROW_ENA by the propagation delay through three inverters and a NOR gate, the active low of COL_PCH does not overlap the active high of ROW_ENA.

The high LDDAD (load direct address) and low LDRN, LDR0, LDR1, and LDBAD during C1 high (and thus C4 low) imply the transmission gates 420 on the input busses DA(7:0), R0(7:0), and R1(7:0) in the lefthand portion of FIG. 4 (RAM_COL_SEL) pass D0 to feedback loop 440, D3 to feedback loop 441, and D4 to feedback loop 442. Note that the bits of DA(7:0) are labelled D7, D6, . . . D1, D0, the bits of R0(7:0) are labelled R0(7), R0(6), . . . R0(1), R0(0), and the bits of R1(7:0) are labelled R1(7), R1(6), . . . R1(1), R1(0). The feedback loops 440–442 use inverters with relatively small gate width to length ratios, so the signals on the address bus (and R0 and R1 if the related transmission gates were conducting) drive the feedback loops 440–442 into the states corresponding to D0, D3, and D4, respectively. Note that the feedback loops 440–442 hold their states until the next machine cycle C1 high that will activate some of the transmission gates 420. NAND gates 450–453 decode the D3–D4 from feedback loops 441–442 to generate the column select signals are nodes CS0–CS3. In this example, the address 20 Hex on DA(7:0) equals 0010 0000, so D3=0 and D4=0 and thus CS0 is high and CS1–CS3 are all low. This is the column select (see FIG. 9) in array RAM_ARRAY of the column pairs COL(0)–COL(1) and COL(8)–COL(9). Of course, once LDDAD goes low, the feedback loops 440–442 are isolated from the input nodes and retain the address data until the next C1.

FIGS. 4a and 4b also show the generation of signals on nodes RDDEC (read decode) and WRDEC1 and WRDEC2 (write decodes) from inputs C4, D0, D3, D0, R00, R10, and CSL. In this example, during the second cycle C1 high LDDAD is high and D0=0, so the feedback loop 440 stores a corresponding state, and RDDEC is low. Now CSL is high (see FIG. 3); hence, WRDEC1 and WRDEC2 are also low. But during C3 and C4 high, CSL will go low and the D0=0 stored in 440 will then drive WRDEC2 high and leave WRDEC1 low. WRDEC2 high selects column pairs COL(0)–COL(1) through COL(7)–COL(8) in RAM_ARRAY. Thus the example with D0=D3=D4=0 selects the column pair COL(0)–COL(1).

The high LDDAD and low LDRN, LDR0, LDR1, and LDBAD during the second cycle C1 high imply that the transmission gates 520 on the input lines DA(7:0), R0(7:0), and R1(7:0) in the lefthand portion of FIG. 5 (RAM_ROW_SEL) pass D1 to feedback loop 540, D2 to feedback loop 541, D5 to feedback loop 542, D6 to feedback loop 543, and D7 to feedback loop 544. These feedback loops use inverters with relatively small gate width to length ratios, so the signals on the DA bus drive the feedback loops 540–544 into the states corresponding to D1, D2, D5, D6, and D7, respectively. The feedback loops 540–544 output their states at nodes RW0–RW4 and the complements at nodes RW0N–RW4N, and these nodes are connected to the row decoders of FIGS. 6a–b. Thus for the example which has D5=1 and the remaining Dj=0, RW2 is high and the remaining RWj are all low. Once LDDAD goes low at C2–C4, the address is loaded and feedback loops 540–544 are isolated and retain their state until the next C1 high.

FIGS. 6a–b show the row decoding circuitry, and the NAND gates simply decode as a 5-bit binary number; e.g., (RW0,RW1,RW2,RW3,RW4)=(0,0,0,0,0) drives ROW(0) high and the remaining ROWj) for j=1,2, . . . 31 all low. Thus for this example, RW2=1 and the remaining RWj zero (low) makes ROW(4) high and the remaining ROW(j) all low. The ROW_DIS (row disable) node must be low for memory access; otherwise the pull down n-channel FETs will make all of the ROW(j) low. Similarly, ROW_ENA (row enable) node must be high to power the output inverters and permit one of the ROW(j) to be high. ROW_DIS and ROW_ENA derive from C1–C4 as described in connection with FIGS. 3a and 3b. Thus ROW(4) is high during C2 and C4, and pulled to low during C1 and C3; whereas, all of the other ROW(j) remain low throughout.

Figure 7B:
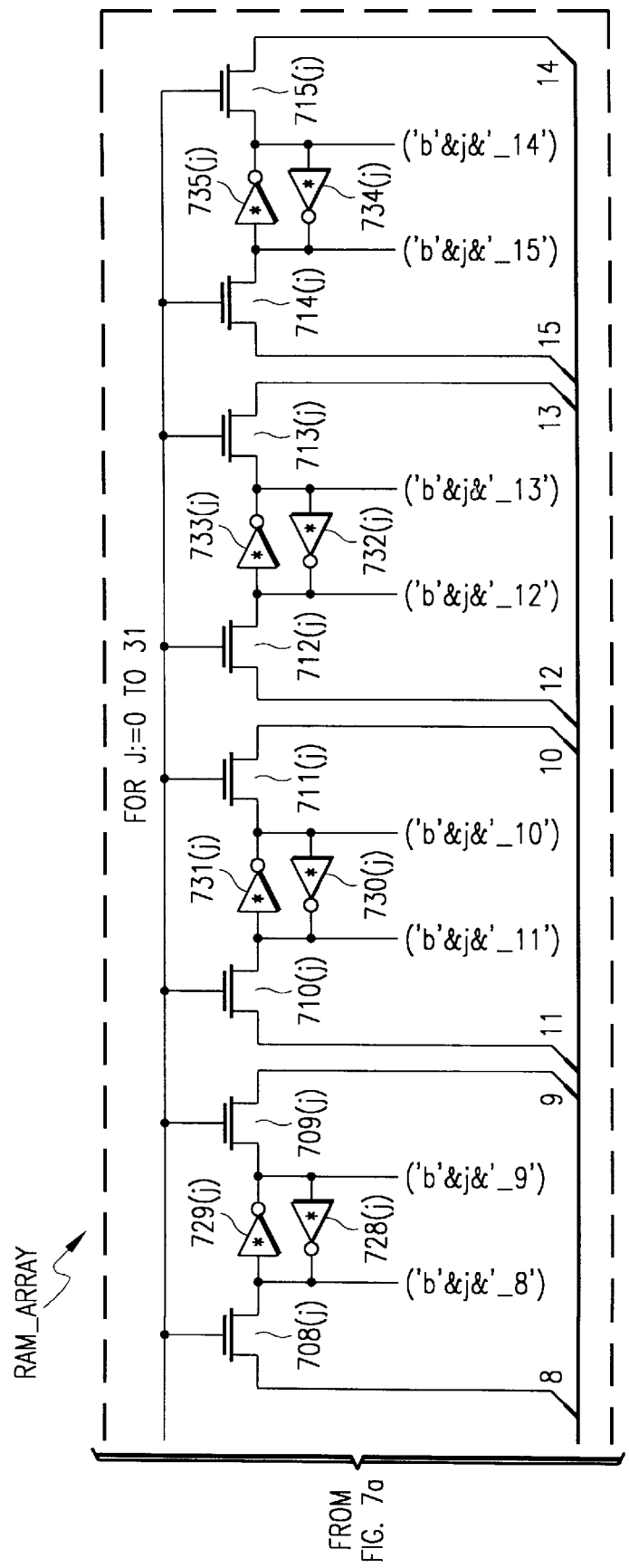

FIGS. 9a and 9b shows the column access to the memory array RAM_ARRAY; the memory cells are not shown explicitly but are arranged in thirty-two rows in the spaces between the column precharge p-channel FETs 900–915 at the top of FIGS. 9a and 9b and the column sensing n-channel FETs 920–935. The selection of the kth row is illustrated in FIGS. 7a and 7b: ROW(j) is high for j=k and low for all thirty-one other js that are not equal to k. ROW(k) high turns on the sixteen pass FETs 700(k)–715(k) but leaves off the other 700(j)–715(j) for all j not equal to k and thereby connects the columns (bitlines) COL(0)–COL(15) to the kth row cells made of feedback loop pairs of inverters 720(k)–735(k) and isolates the other cells made of feedback loop pairs of inverters 720(j)–735(j) for all j not equal to k. Recall (see FIG. 2) that the array shown in FIGS. 7a, 7b, 9a and 9b is one of eight copies so each row and column address accesses eight bits (one byte) in parallel (i=0 to 7 in FIGS. 2a and 2b. And the particular memory cell and pair of columns selected to be connected to one of the eight lines of bus DB (a bit is called DBX in FIG. 9) follows from the CS0–CS3 and WRDEC1–WRDEC2 (write) or RDPEC (read) signals as follows.

First, only one of CS0–CS3 is high (recall FIGS. 4a and 4b which shows CS0–CS3 as the decoded version of the two bit binary number D3–D4 if LDDAD is high). For the example of 20 Hex on bus DA(7:0), CS0 is high; and thus n-channel FETs 940–941, 948–949, 960, and 964 are turned on and n-channel FETs 942–947, 950–955, 961–963, and 965–967 are all off. Also, RDDEC is just the "read decoded" D0 (RDDEC is high for D0=1 and low for D1=0 if LDDAD is high), and only one of WRDEC1–WRDEC2 is high and then only when C4 is high and CSL is low (both WRDEC1 and WRDEC2 are low if C4 is low or if CSL is high) and is "write decoded" D0. Indeed, when C4 is high and CSL is low, WRDEC1 is high if D0=1 and WRDEC2 is high if D0=0 as in the example. Thus to read or write a memory cell with LDDAD high, the bits D0,D3,D4 on bus DA are decoded to either RDDEC and CS0–CS3 or WRDEC1–WRDEC2 and CS0–CS3, respectively. Now in the example the contents of the Accumulator (55 Hex) are to be written into the Register with address 20 Hex; so during the second C4 high interval in FIG. 11 the 55 has been put on bus DB(7:0) by block ALU_TOP and block PLA_TOP drives DIR_WRT low during intervals C3 high and C4 high and has RMDB high to pull RDEN low (see FIG. 3) . Thus during C4 high WRDEC2 is high due to D0=0 on bus DA(7:0) and WRDEC1 is low, and this turns on n-channel FETs 920–927 and turns off n-channel FETs 928–935. Hence, as seen in FIGS. 9a and 9b, during C4 high the bit DBX (one of eight on bus DB(7:0)) is inverted by inverter 980 and again by inverter 981 and then passed through turned-on FETs 940–920 and 941–921 and up columns COL(0) and (inverted) COL(1) to drive the memory cell in the 4th row to the corresponding bit of the 55 Hex on bus DB(7:0). That is, for X from 7 to 0 the eight bits DBX are 01010101 and are written into the corresponding eight memory cells in the 4th row and between columns COL(0) and COL(1) in the eight copies of the array RAM_ARRAY. Note that during this write operation RDEN is high so that n-channel FET 982 remains off. This completes the execution of the instruction MOV 20, A with the contents of A being 55 Hex.

FIG. 13 illustrates the correlation between the register addresses in terms of rows and columns and the address that appears on bus DA(7:0). For example, the register R20 is at ROW(4) and column pair COL(0)–COL(1). Note that the working registers in the four Banks (eight registers in each Bank and reassigned as R0–R7 in instructions) are columnwise located: Bank1 registers are in the first and fifth columns, Bank2 in the second and sixth columns, Bank3 in the third and seventh columns, and Bank4 in the fourth and eighth columns. Thus the two lowest-address registers (reassigned as R0 and R1) for the four Banks of working registers make up the row ROW(0); note that the notation is confusing in that R0 may be R00, R08, R10, or R18 and R1 may be R01, R09, R11, or R19, depending upon the selected Bank.

Figure 14:
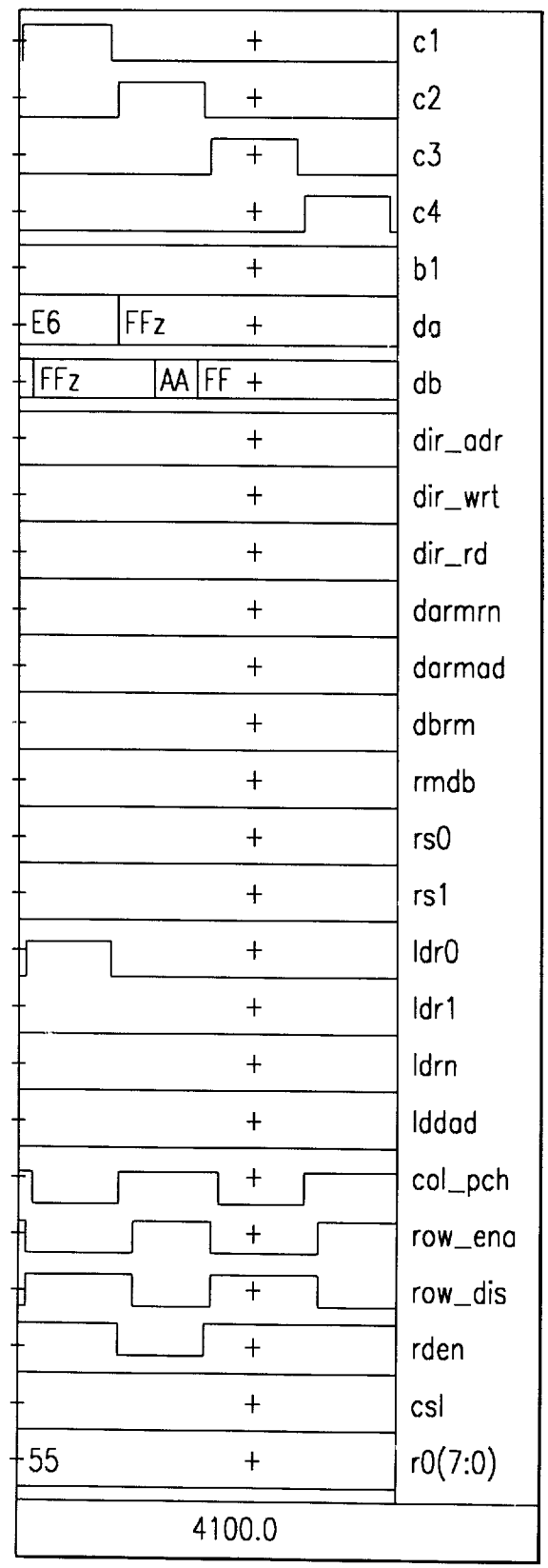

FIG. 14 shows the timing for execution of the instruction MOV A, @R0 which uses register indirect addressing and moves the contents of the Register Rn to the Accumulator; the contents of Register R0 provides the address of Register Rn. In the example illustrated in FIG. 14, the contents of R0 is 55, and the contents of R55 is AA. This register indirect addressing will use the quick access to the contents of the R0, R1 Registers to execute the instruction in one machine cycle. The opcode for MOV A,@R0 is 1110 0110 (E6), whereas the opcode for the working register addressing instruction MOV A,Rn is 0001 1$n_1n_2n_3$ with $n_1n_2n_3$ the binary for n. Decoder 320 (FIG. 3) takes the opcode from bus DA(7:0) to generate LDR1, LDR0, and LDRN. During C1 high the opcode E6 for MOV A,@R0 on bus DA(7:0) is decoded in PLA_TOP to set DIR_RD, DIR_WRT, DIR_ADR, DARMRN, DARMAD, DBRM, and RMDB all inactive high and is also decoded in RAM_CNTL by decoder 320 to make LDR0 high and LDR1 and LDRN low (panels 17–19 in FIG. 14). Note that B1 is high, so AND gate 306 is high during C1 high, and this drives NOR gate 308 low to release NOR gates 321–323 in decoder 320 from being held low and allows LDR0 to go high.

FIG. 8, a gating circuit 1004, shows that the R0 and R1 Registers in the selected one of the four banks both already have their contents byte on busses R0(7:0) and R1(7:0), respectively. That is, the memory cells in row ROW(0) are tapped (via port 2 1002) between one of the feedback loop inverters and a column pass FET. Thus busses R0(7:0) and R1(7:0) provide quick access to the R0 and R1 Registers for the selected Bank, and when LDR0 goes high during C1 high the corresponding transmission gates 420 (FIG. 4) conduct to pass bits R0(0), R0(3), and R0(4) (in place of the D0, D3, and D4 previously described) to define the column select CS0–CS3 and read/write RDDEC, WRDEC1, and WRDEC2 signals. Similarly, the transmission gates 520 pass bits R0(1), R0(2), R0(5), R0(6), and R0(7) (in place of the D1, D2, D5, D6, and D7 previously described) to define the row select ROW(j) signals. Of course, these row and column signals are just the address bits for Register R55 which equal 0101 0101. So ROW(10), CS2, and RDDEC are all high; this corresponds to the register R55 at the 10th row and 12th–13th column pair. WRDEC1 and WRDEC2 are both low because CSL is high. The address bits for Register R55 are held in feedback loops 440–442 and 540–544 and will be isolated from the R0 bus when LDR0 goes low at the end of C1 high.

During C2 high the contents AA (=1010 1010) of Register R55 are read onto bus DB(7:0) as follows. First, the transition of COL_PCH from low to high at the end of C1 high has left nodes 985 and 986 high and floating and also the columns COL(0)–COL(15) high and floating. See FIGS. 9a and 9b and recall that there are eight copies of this Figure: one for each bit of the register contents byte. Next, ROW (10) high connects the memory cells in the 10th row to the columns COL(0)–COL(15), and thus one column of each pair is discharged to low and the other remains high. But one column of each pair is connected by an inverter to the gate of one of FETs 970–977. Then CS2 high turns on FETs 962 and 966. Now if COL(12) is high because a 1 is stored in the memory cell in the 10th row (as is the case for bits 7, 5, 3 and 1 of the example contents AA), then FET 976 remains off and node 986 remains floating high; whereas, if COL(12) has been discharged due to a 0 stored in the memory cell (as is the case for bits 6, 4, 2, and 0), then FET 976 turns on and pulls node 986 down to low. Similarly, COL(4) high implies node 985 continues floating high, but COL(4) low turns on FET 972 to pull node 985 low. Now node 985 and RDDEC are the inputs to OR gate 990, and RDDEC is high, so the output of OR gate 990 is high regardless of the state of node 985. Conversely, node 986 and the complement of RDDEC are the inputs to OR gate 991, so the output of OR gate 991 is low. That is, RDDEC has decoded the R0(0) bit for a read by selecting between the left and right halves of the memory array in FIG. 9. The inputs to AND gate 992 are just the outputs of OR gates 990–991, so AND gate 992 output just reflects the state of node 986 and feeds NOR gate 993. The other input of NOR gate 993 is a low RDEN due to C2 high plus B1 high which drives NOR gates 330 and 302 both low. So with RDEN low, the output of NOR gate 993 is the complement of the state of node 985, and thus node DBX will be pulled low by FET 982 if node 986 is low, and DBX will see a high impedance if node 986 is high. Thus the stored contents AA of Register R55 are readable on DB(7:0) by the end of the C2 high interval; see the seventh panel of FIG. 14. The contents of R55 are then moved to the Accumulator during C3 and C4 high. This completes the execution of the instruction MOV A,@R0. In effect, the contents of the R0 and R1 Registers were always available on busses R0(7:0) and R1(7:0) which paralleled bus DA(7:0) and were selectable in place of DA(7:0) for the row and column decoders by the LDR0 and LDR1 signals; and decoder 320 quickly generates the LDR0 and LDR1 signals from the opcode on bus DA(7:0).

Figure 15:
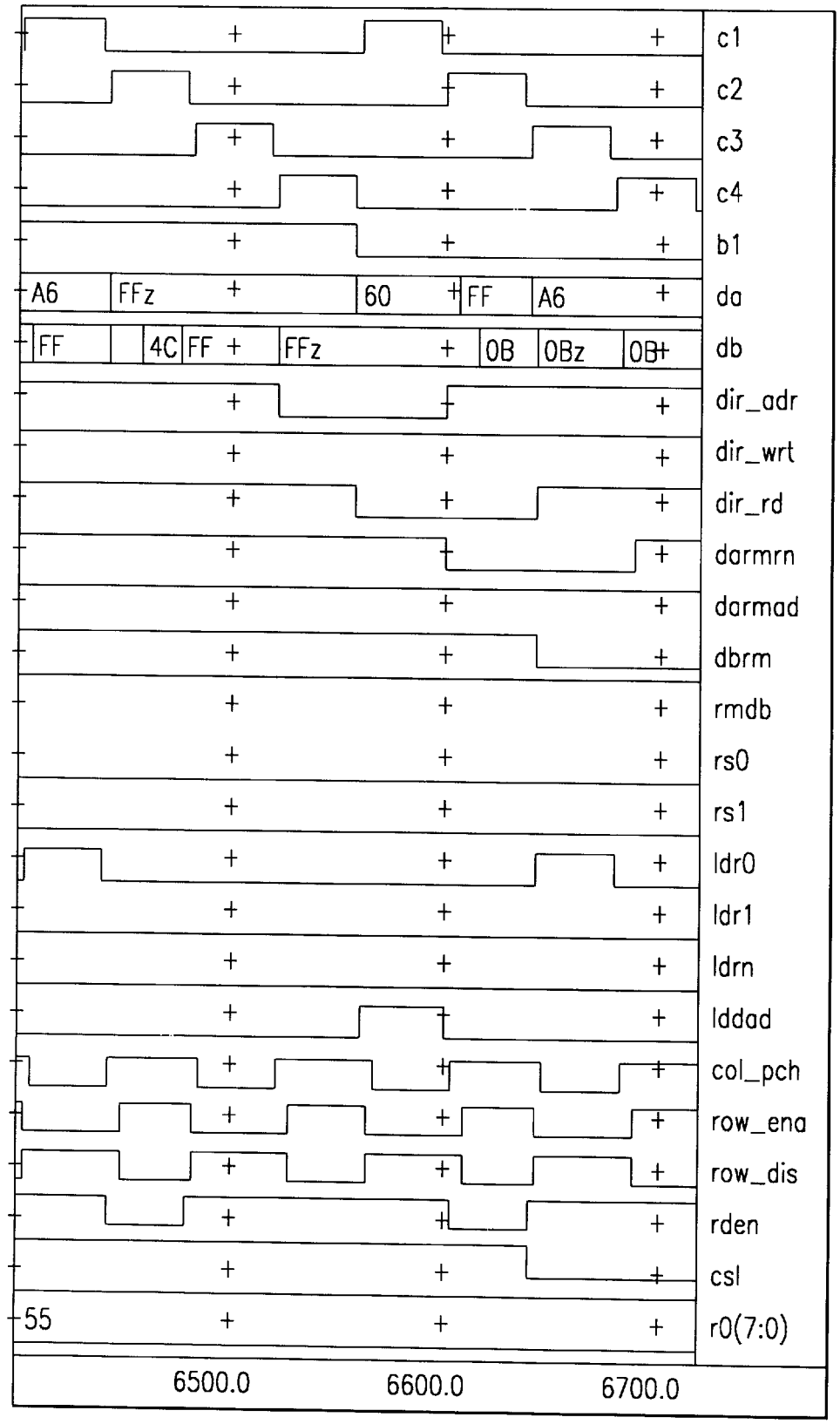

FIG. 15 is a timing diagram for the instruction MOV @R0,60 which is a two machine cycle, two byte instruction that puts the contents of R60 into Rn where n is the contents of R0; that is, MOV @R0,60 uses a type of register indirect addressing. The example of FIG. 15 presumes that the contents of R0 is 55 (as seen on the R0(7:0) bus in the last panel) and that the contents of R60 is 0B (panel seven shows 0B on bus DB(7:0) in the C4 subinterval of the second cycle). The opcode for the instruction is A6 and appears on bus DA(7:0) as shown in the C1 subinterval of the first cycle and teh C3 and C4 subintervals of the second cycle, and the second instruction byte is the data source address 60 and appears on bus DA(7:0) as shown in the C1 subinterval of the second cycle. The DARMRN signal from PLA_TOP goes low (active) during the C2 and C3 subintervals of the second cycle and puts the contents of the instruction register (opcode A6) on data bus DA(7:0) which then decodes to drive LDR0 high for using the R0 contents as the target address (55) into which to write the contents from DB(7:0) when DBRM goes low (active) during the C3 and C4 subintervals. The DIR_ADR and DIR_RD signals low (active) during C4 of the first cycle and C 1 and C2 of the second cycle put the contents of R60 onto data bus DB(7:0); see panels eight and ten of FIG. 15.

Fractional Clock Timing

Figure 16:
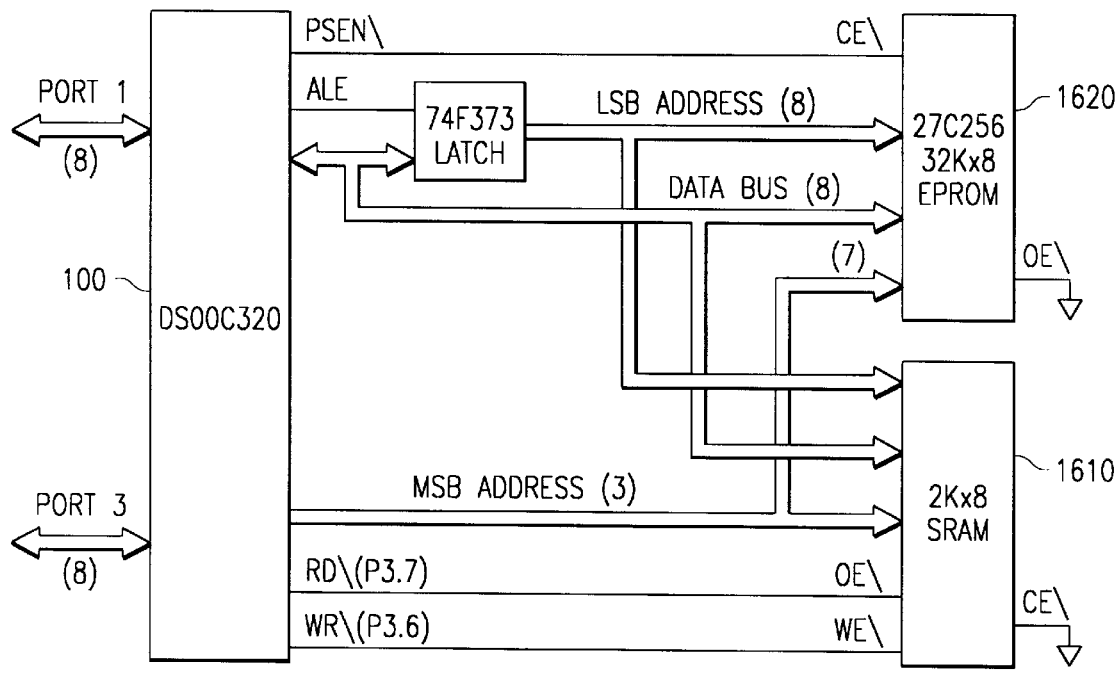
FIG. 16 shows memory coupling to the first preferred embodiment.
Figure 18G:
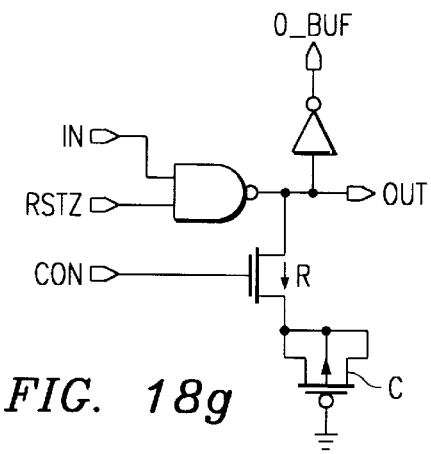
FIGS. 18a, 18b, 18c, 18d, 18e, 18f, 18g, 18h, and 18i are block diagrams of the fractional clock timing circuitry of the first preferred embodiment.
Figure 18H:
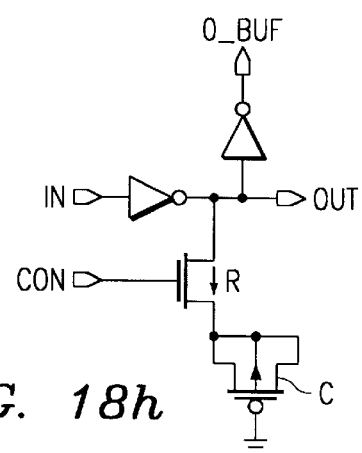
Figure 19:
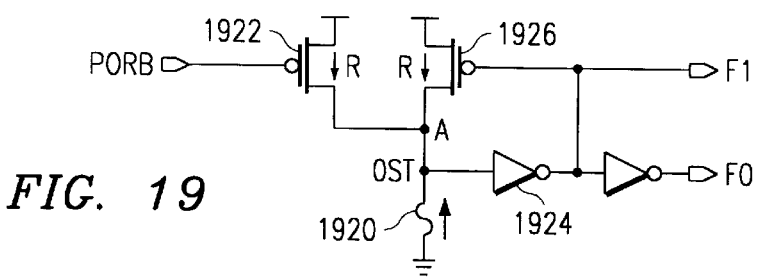
FIG. 19 illustrates the fuse type used in the fractional clock timing cirucitry.
Figure 17:
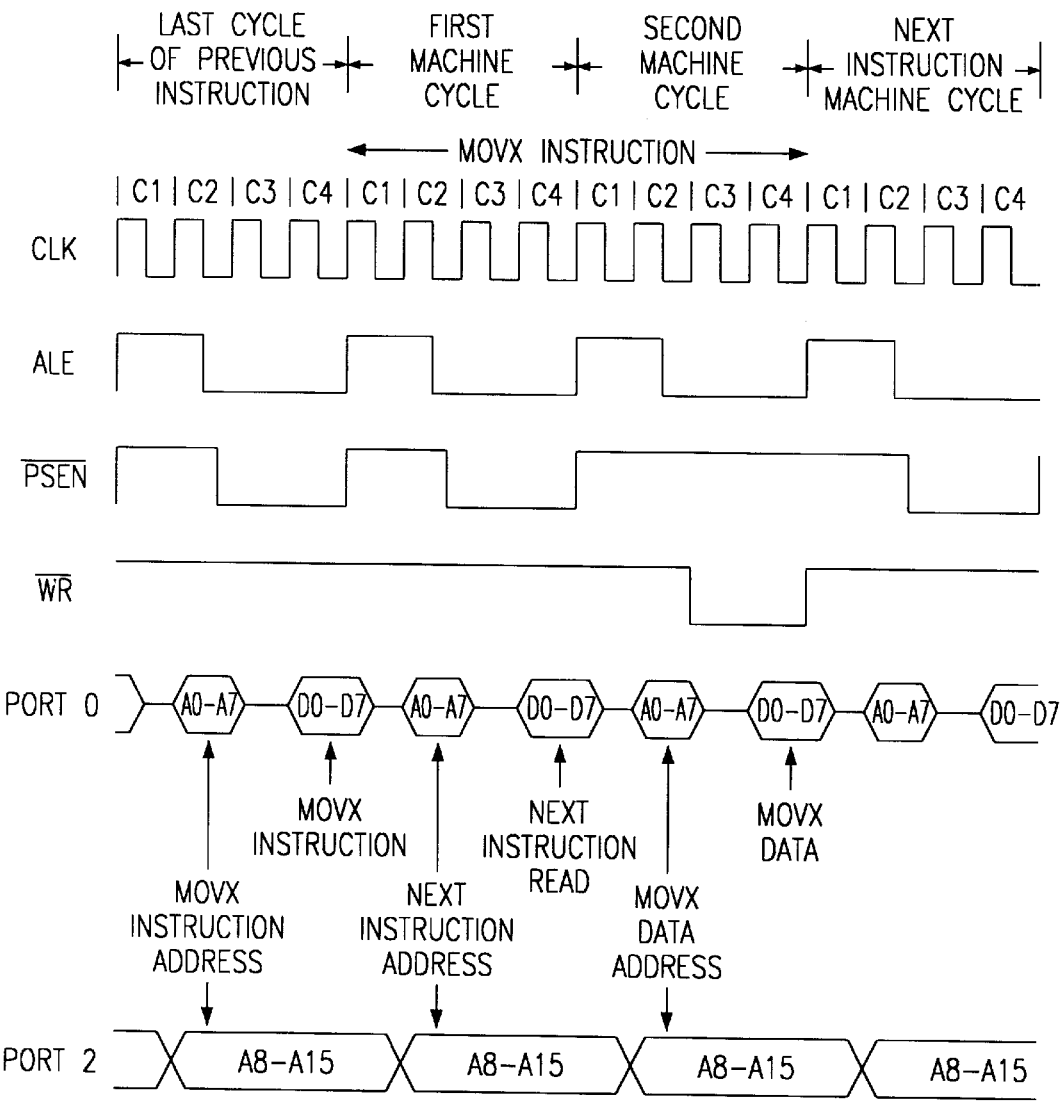
FIG. 17 is a timing diagram of memory access.
Figure 18A:
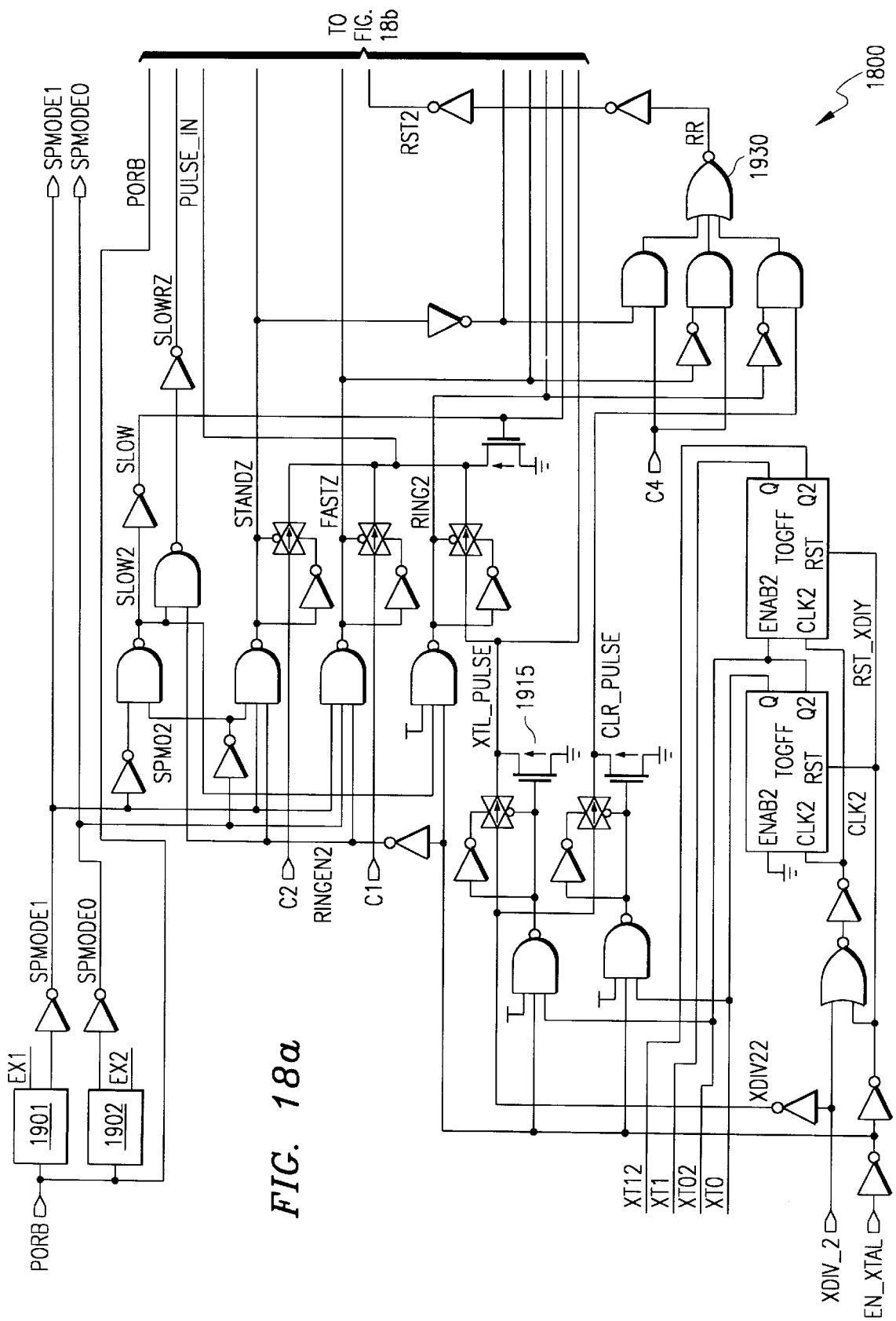

FIG. 16 shows preferred embodiment 100 coupled to external memories 1610 and 1620, and FIG. 17 is a timing diagram for an access to memory 1610 (a MOVX command). The crystal oscillator periods generate the C1, C2, C3, and C4 clocks previously described in connection with the register indirect addressing, but the memory chip enable signal, PSEN\, has a falling edge which does not coincide with an oscillator edge. The location of the PSEN\ falling edge determines the required speed of the memory chip, and thus close control of the falling edge will permit the use of the slowest (and cheapest) feasible memory chips. The PSE\falling edge needs a delay from the C2 rising edge, and preferred embodiment 100 makes this delay a constant fraction of the C2 period for all crystal oscillator frequencies in a range. In particular, FIGS. 18a–19 show feedback-synchronized multitap delay line 1800 with input pulses selectable from C1, C2, and the oscillator divided by 2 (XDIV_2) and three selectable delayed versions of the input at outputs DEL_20, DEL_30, and DEL_TD3. Feedback controls the delay to synchronize delay line 1800 with the crystal oscillator so that the delays are proportional to the oscillator period, as detailed in the next paragraphs.

Figure 18B:
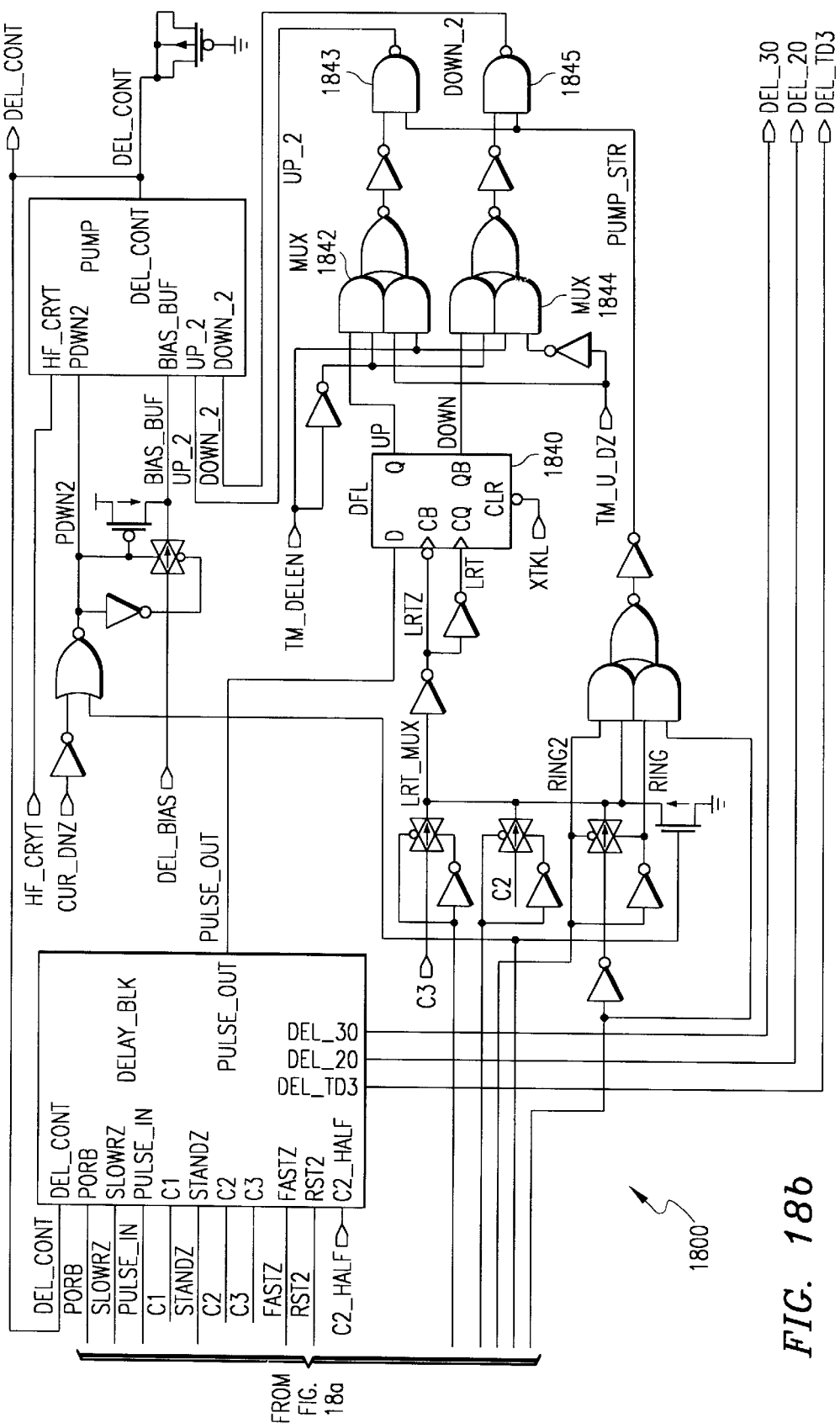
Figure 18C:
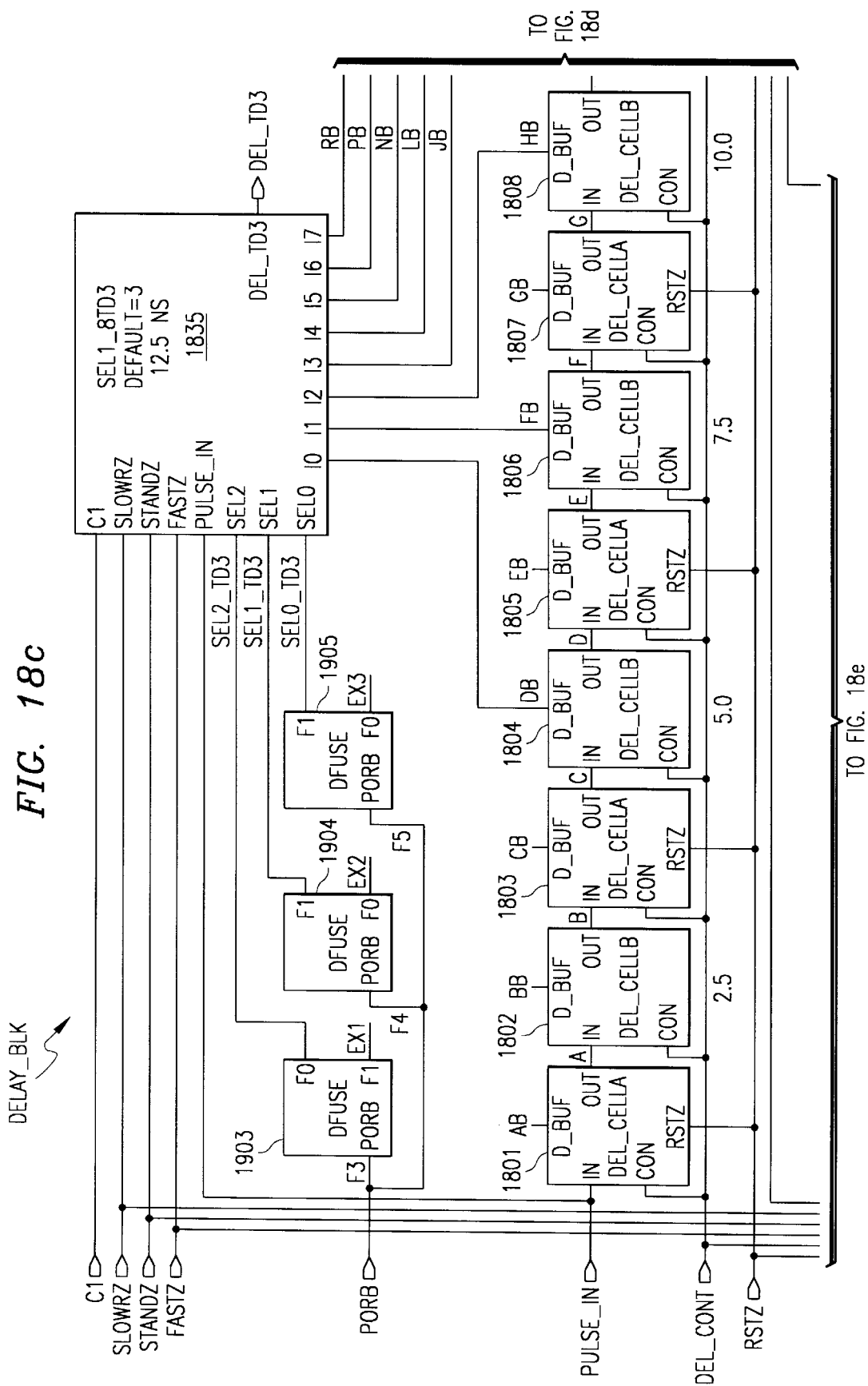
Figure 18D:
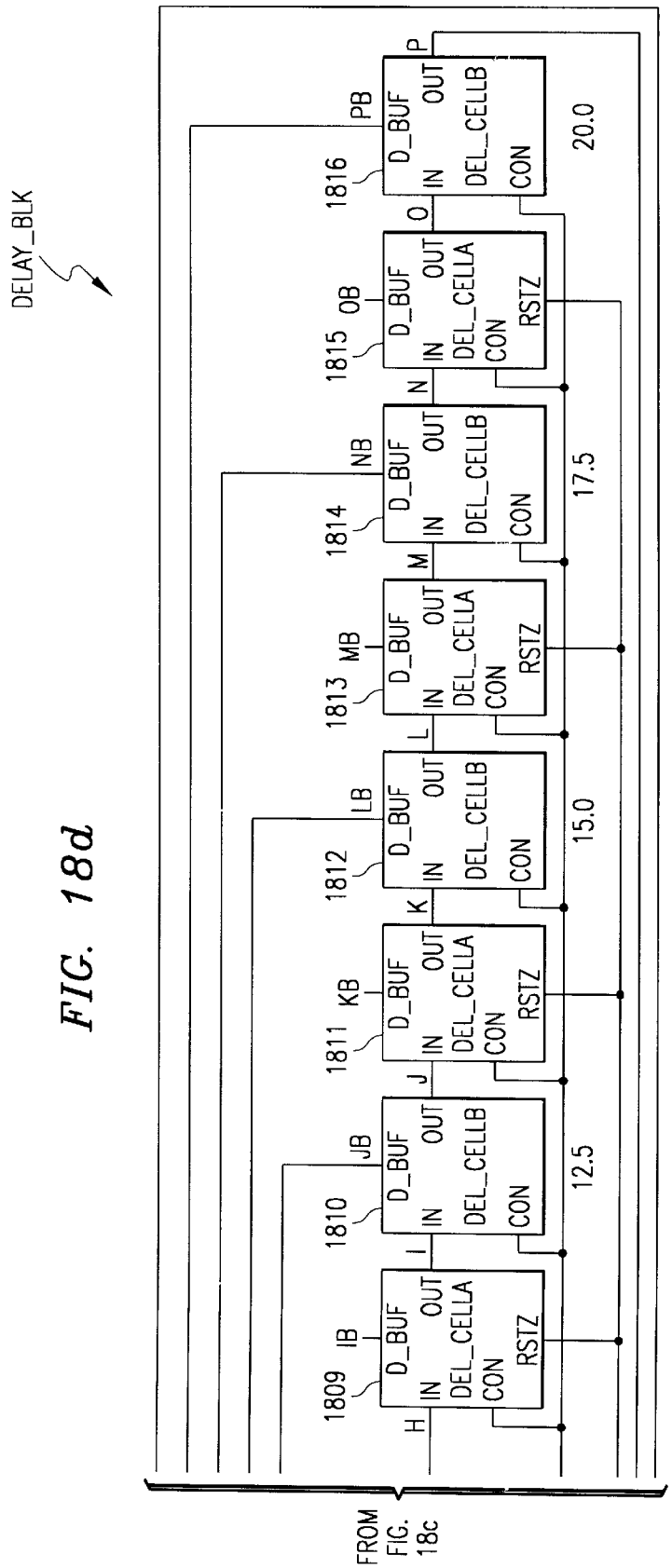

The lefthand portion of FIG. 18a provides the selection among C1, C2, and XDIV_2 to be the input pluses (PULSE_IN signal) for the block of delay cells DELAY_BLK. FIG. 18b shows DELAY_BLK as including thirty-two delay cells, 1801–1832, forming a delay line with each odd-numbered cell having the structure of FIG. 18c and each even-numbered cell having the structure of FIG. 18d. PULSE_IN connects to the IN node of cell 1801; the IN node of each of cells 1802–1832 connects to the OUT node of the preceding cell; and the OUT node of cell 1832 connects to the PULSE_OUT node. The NAND gate of FIG. 18c and the IN inverter of FIG. 18d are loaded by a capacitor of capacitance C connected to the inverter output through an n-channel FET with gate driven by the voltage at node CON; and node CON of each cell connects to line DEL_CONT. Thus the capacitive loading is the same for each NAND gate or IN inverter in cells 1801–1832 and depends upon the capacitance C and the impedance of the connecting FET: as the voltage on line DEL_CONT increases, the FETs are turned on harder and their impedance decreases to increase the capacitive loading. With the voltage on line DEL_CONT low (the n-channel FET turned off in each cell), the delay for a rising or falling edge passing from IN to OUT is about 1 nanosecond (ns); whereas with a high voltage on line DEL_CONT (the n-channel FETs turned on hard), the delay is about 2 ns. The delay increases continuously as the voltage on DEL_CONT increases, and this underlies the feedback synchronization as follows.

The delayed version of a pulse input at PULSE_IN appears at PULSE_OUT with a delay of between about 32 and 64 ns, depending upon the voltage on line DEL_CONT, and connects to the D input of flip-flop 1840. The clocking of flip-flop 1840 is selected from C2, C3, and XDIV_2 by use of the same selection lines as for selection of the input pulse to PULSE_IN. That is, when C2 drives PULSE_IN, C3 clocks flip-flop 1840; when C1 drives PULSE_IN, C2 clocks flip-flop 1840; and when XDIV_2 drives PULSE_IN, it also clocks flip-flop 1840. Then if the rising edge input, say C2, at PULSE_IN traverses the delay cells 1810–1832 and appears at PULSE_OUT prior to the rising edge of C3 clocking flip-flop 1840, then when C3 clocks the flip-flop the D input will be high and Q output will be set high and the QB output set low. The Q high then passes through multiplexer 1842 and NAND gate 1843 and the QB low passes through multiplexer 1844 and NAND gate 1845 to enable a negative pulse on the UP_Z input of charge pump block PUMP and drives the DOWN_Z input high. Conversely, if the rising edge input traverses the delay cells and appears at PULSE_OUT after the rising edge of C3 has clocked flip-flop 1840, then the Q output is low and the QB output high and these drive the UP_Z input high and enable a negative pulse on DOWN_Z. As detailed in the next paragraph, UP_Z low for a period of the oscillator will increase the voltage on line DEL_CONT by a fixed amount, and DOWN_Z low will similarly decrease the voltage by a fixed amount. Hence, the voltage on line DEL_CONT will stabilize about the voltage which generates a delay of 1/32 of an oscillator period in each delay cell 1801–1832.

Figure 18E:
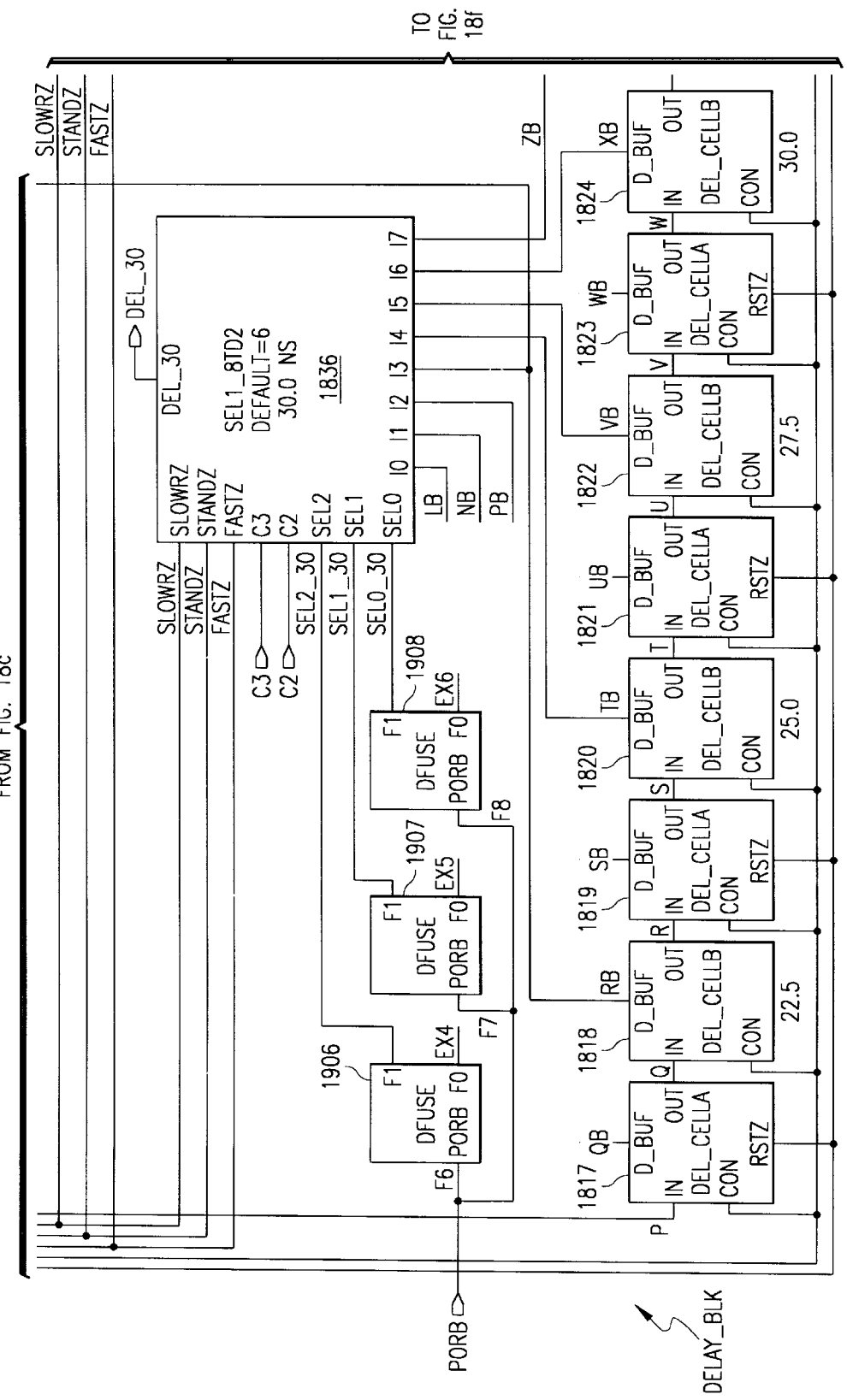
Figure 18F:
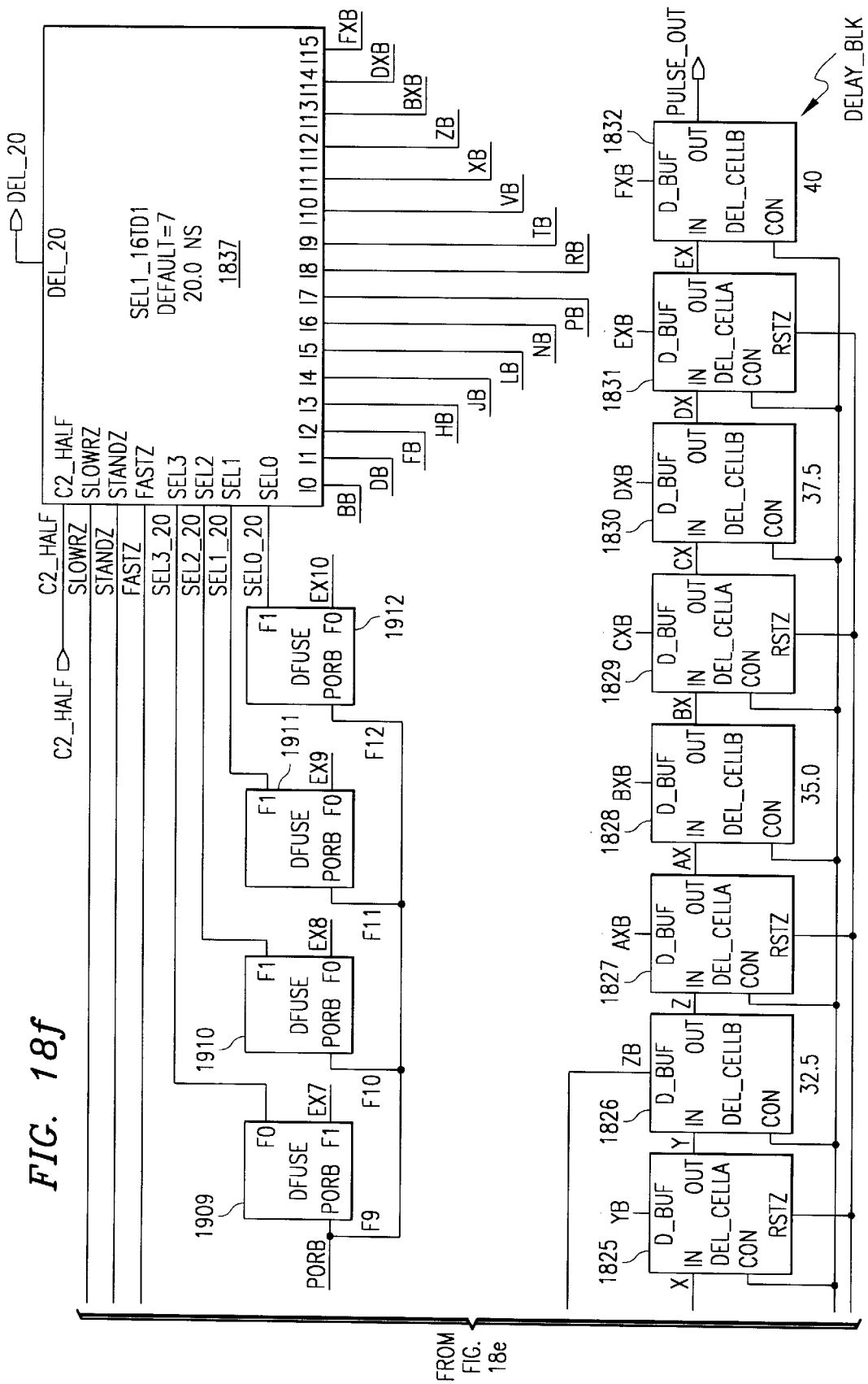
Figure 18I:
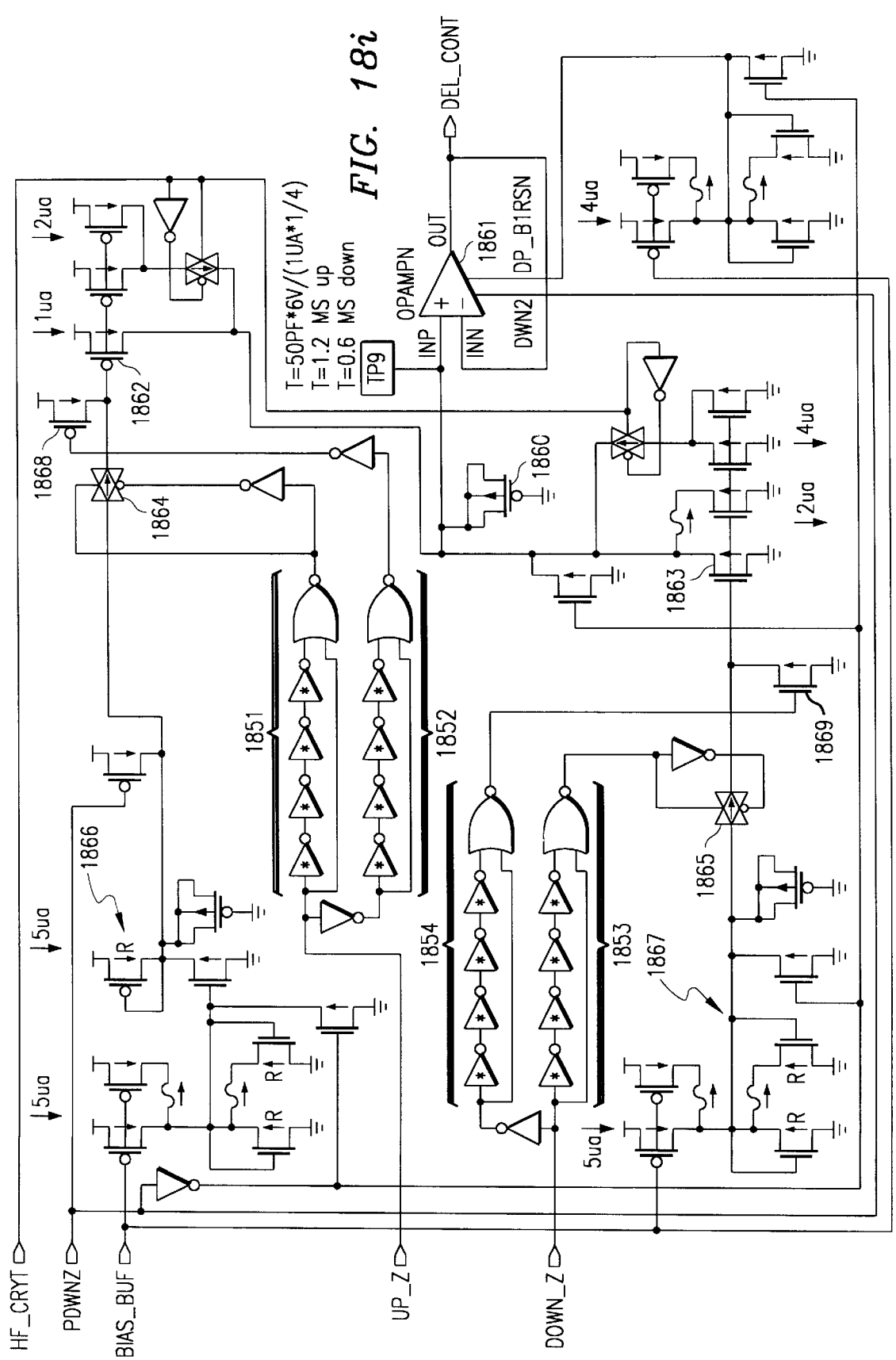

FIG. 18e shows charge pump PUMP as including voltage follower 1861 applying the voltage on capacitor 1860 to line DEL_CONT which, as previously described, controls the delay of the cells 1801–1832. Now, turning on p-channel FET 1862 will charge up capacitor 1860 and turning on n-channel FET 1863 will discharge capacitor 1860; this provides the control of the voltage on capacitor 1860. When UP_Z is low, subcircuit 1851 (four inverters in series plus a NOR gate) outputs a high to make transmission gate 1864 conducting and current mirror 1866 then biases FET 1862 to provide a fixed charging current to capacitor 1860. Similarly, when DOWN_Z is low, subcircuit 1853 makes transmission gate 1865 conducting and current mirror 1867 biases FET 1863 to provide a fixed discharging current to capacitor 1860. Because UP_Z and DOWN_Z derive from the Q and QB outputs of flip-flop 1840, the charging and discharging currrents are not applied simultaneously. When UP_Z is high, transmission gate 1864 turns off and subcircuit 1852 provides a low to pull up p-channel FET 1868 to pull up the gate of FET 1862 and stop the charging current. Similarly, when DOWN_Z is high, subcircuit 1854 provides a high to pull down n-channel FET 1869 to turn off FET 1863 and stop the discharging current. Each of the subcircuits 1851–1854 has a rising input edge delay due to the series inverters, and this insures no overlap of the signals and precludes shoot through currents.

In summary, the clocking of flip-flop 1840 one oscillator period after the input at PULSE_IN provides the feedback to adjust the voltage on line DEL_CONT to thereby adjust (feedback) the capacitive loadings in the delay cells 1801–1832 so the delay through the delay line just equals one oscillator period, regardless of the oscillator frequency as long as the period is in the range of the delay line (40 to 80 ns). Thus the delay through each delay cell equals 1/32 of an oscillator period, and a signal such as the falling edge of PSEN can be synchronized to one of the taps on the delay line. In particular, FIG. 18b also shows multiplexers 1835–1837 which have inputs used to select the delays of the input at PULSE_IN to output at DEL_TD3, DEL_30 and DEL_20, respectively. In particular, multiplexer 1835 is an 8-to-1 multiplexer which selects from delays of 4/32, 6/32, 8/32, . . . , 18/32 of an oscillator period to output at DEL_TD3; multiplexer 1836 also is an 8-to-1 with selection of 12/32, 14/32, . . . , 26/32 of a period to output at DEL_30; and multiplexer 1837 is a 16-to-1 with selection of 2/32, 4/32, 6/32, . . . , 32/32 of a period to output at DEL_20.

The multiplexer selections (and also the selection of the input to PULSE_IN) are set by blowing appropriate fuses 1901–1912 which connect the power on reset line PORB (active low) to the multiplexer selection inputs. FIG. 19 shows the fuse structure which operates as follows. Upon power up of embodiment 100, PORB goes low and then high; so for the case with fuse element 1920 blown, PORB low turns on p-channel FET 1922 which pulls up the input of inverter 1924 which, in turn, outputs a low F1 and turns on pull up p-channel FET 1926. Then when PORB returns high, FET 1922 turns off but FET 1926 remains on to keep the input of inverter 1924 high, and this sets F0=1 and F1=0. Conversely, for the case with fuse element 1920 not blown, when PORB goes low, p-channel FET 1922 never overcomes fuse element 1920 which leaves the input of inverter 1924 low. This turns off pull up FET 1926 and sets F0=0 and F1=1. In particular, FIG. 18a illustrates the F0 output of fuse 1901 inverted to generate the SPMODE1 (SPeed MODE) signal and the F1 output of fuse 1902 to generate the SPMODE0 signal. Thus the following fuse blown combinations occur:

| Fuse 1901 | Fuse 1902 | SPMODE0 | SPMODE1 | PULSE_IN |
|---|---|---|---|---|
| intact | intact | 1 | 0 | 0 |
| blown | intact | 1 | 1 | C1/XTL_PULSE |
| intact | blown | 0 | 0 | 0 |
| blown | blown | 0 | 1 | C2/XTL_PULSE | where EN_XTAL high implies the choice of C1 or C2 and EN_XTAL low implies the choice XTL_PULSE which is an inverted version of XDIV_2 (oscillator divided by 2) passing through transmission gate 1915. The use of C2 is the standard mode, the use of C1 is for fast mode (fast memories), the use of XTL_PULSE is for tuning the phase locked loop when embodiment 100 is operating from an internal ring oscillator rather than the crystal oscillator, and the 0 input (no-delay) is for slow mode with slower speed operation outside of the tracking range of the phase locked loop.

Similarly, the fuse element status of fuses 1903–1905 is decoded in multiplexer 1835 and determine the fractional delay output at DEL_TD3, the fuse elements of fuses 1906–1908 determine DEL_30, and the fuse elements of fuses 1909–1912 determine DEL_20. Of course, multiplexers 1835–1837 could be replaced by a hardwire if the desired delays were always the same; the present use of multiplexers with fuse selection permits more flexible design.

FIG. 18a illustrates NOR gate 1930 which, when driven low, applies a low input to the RSTZ nodes of the odd-numbered delay cells 1801, 1803, . . . 1831. This low RSTZ resets the delay cells and thereby precludes the feedback synchronization locking onto a multiple of the oscillator period. In particular, NOR gate 1930 is driven low when C4 goes high with SPMODE0=0, SPMODE1=1, and EN_XTAL=1 (which selects C2 for PULSE_IN) or when C4 goes high with SPMODE0=1, SPMODE1=1, and EN_XTAL=1 (which selects C1) or when XDIV_2 goes low with EN_XTAL=0 and SPMODE1=1 (which selects XTL_PULSE). Thus two pulses cannot be traversing the delay line simultaneously.

Output Drivers

Figure 20A:
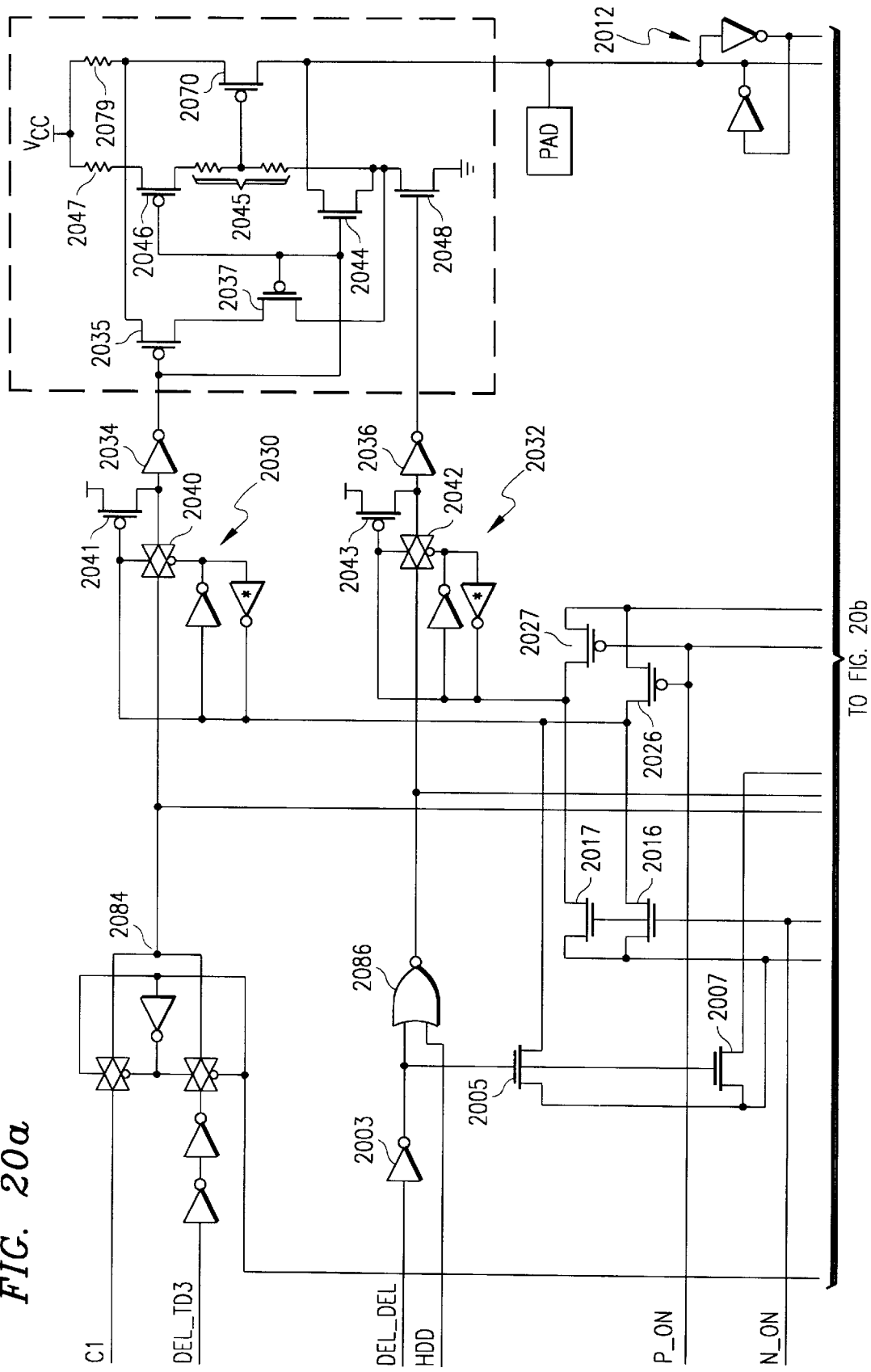
FIG. 20 shows a two-stage output driver of the first preferred embodiment.
Figure 20B:
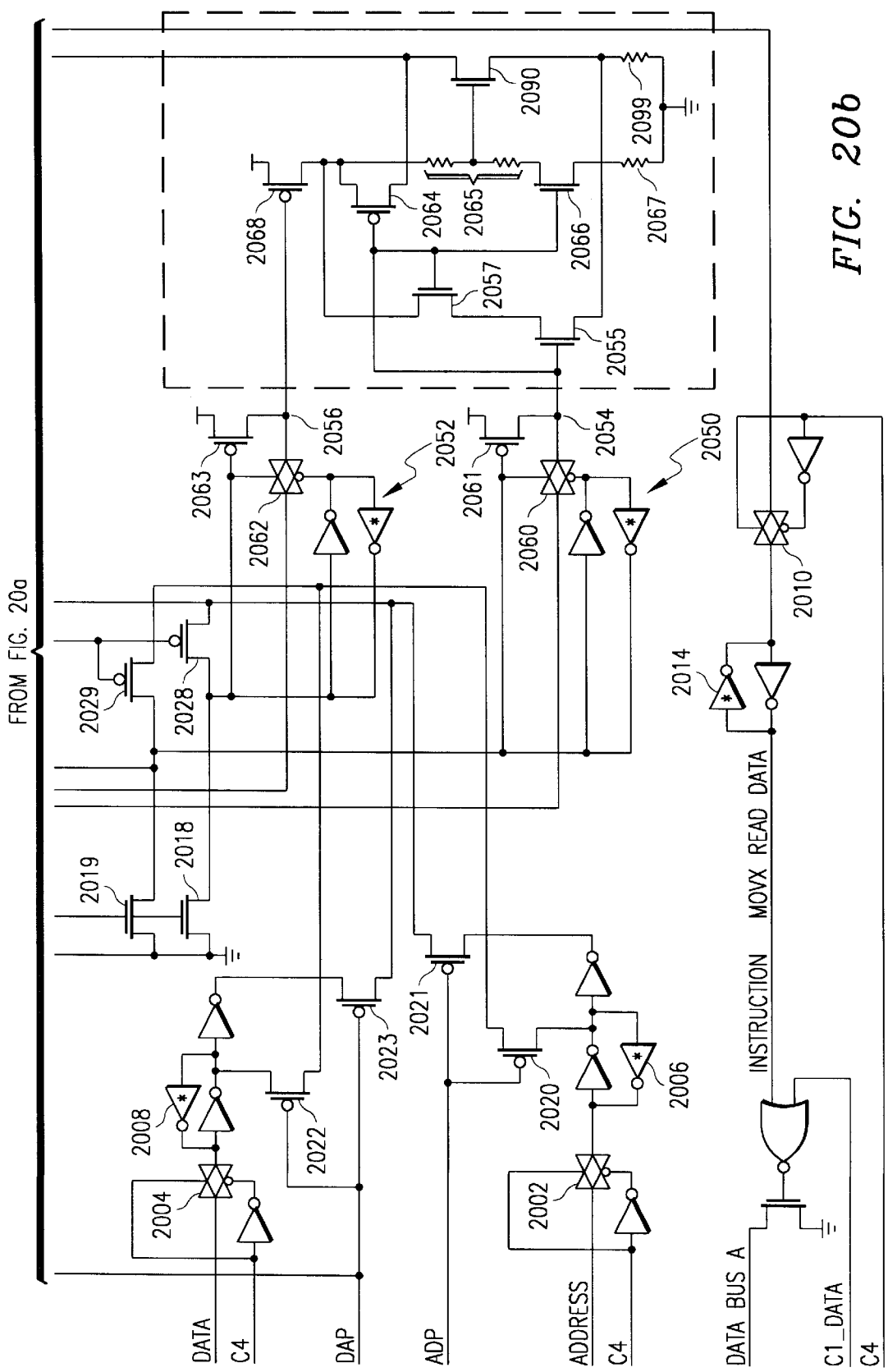
Figure 21A:
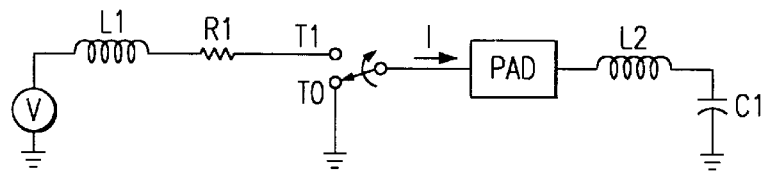
FIGS. 21a–f compare the two-stage output driver with known output drivers.
Figure 21B:
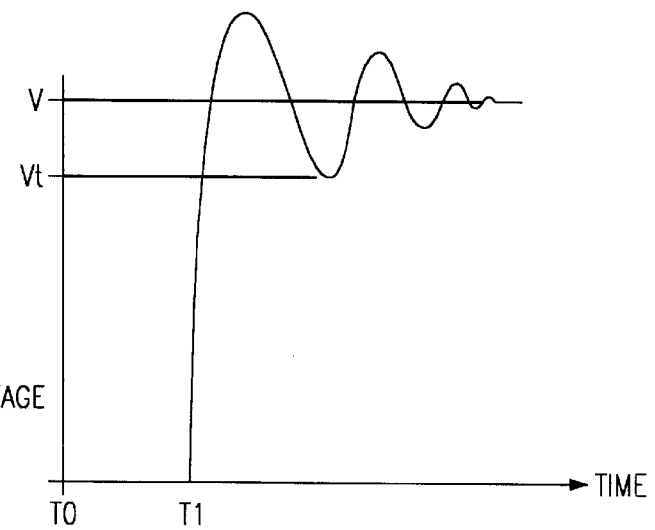
Figure 21C:
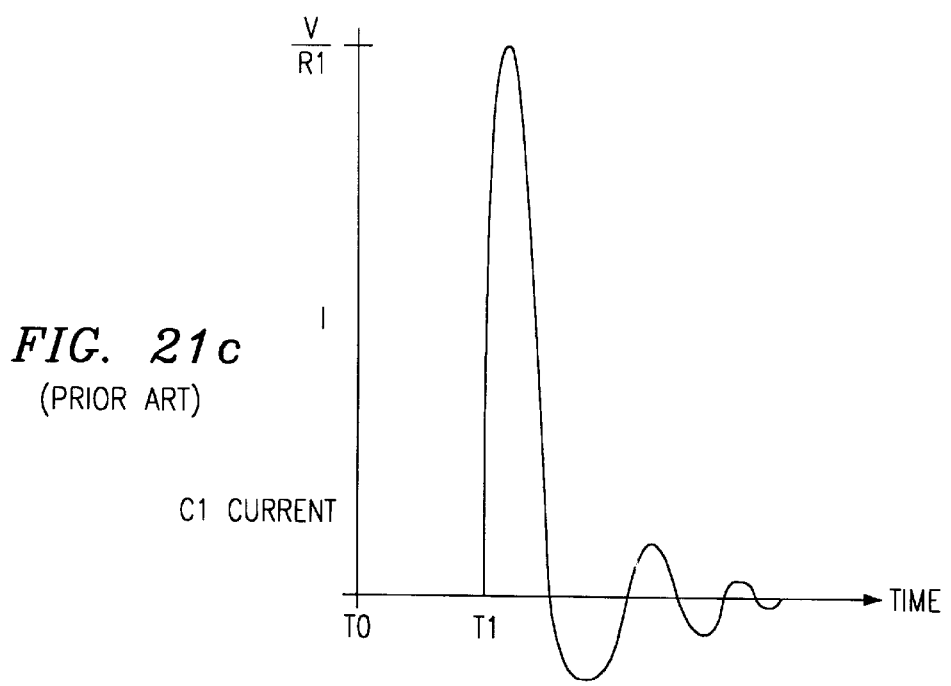

The output pad drivers of preferred embodiment 100 have the structure shown in FIG. 20 to limit ringing when driving capacitive loads. The inductance of the bond wires between a silicon die containing the circuitry of preferred embodiment 100 and the power supply (for an output PAD pull up) or ground (for an output PAD pull down) together with the output PAD load capacitance form an LC circuit subject to ringing. In particular, FIG. 21a heuristically illustrates a typical output driver turning on to pull up PAD with L1 the bond wire inductance of the power supply, L2 the bond wire inductance to PAD, and C1 the load capacitance. FIGS. 21b–c show the corresponding output voltage and current and the possibility that the ringing may drive the output voltage below a threshold and thereby create erratic behavior. The peak current measures the energy stored in the inductances and thus the extent of ringing.

The structure of FIG. 20 provides for a two-stage output current generation to limit ringing. Analogous to FIGS.

Figure 21D:
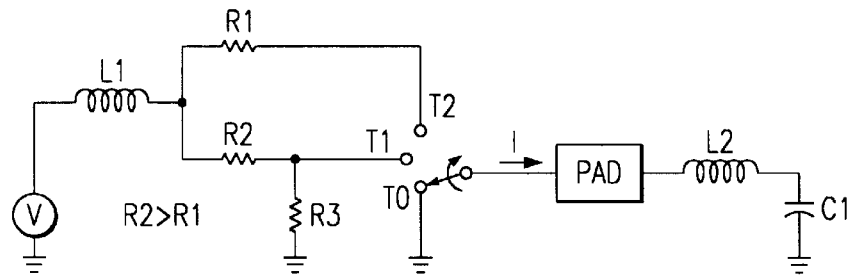
Figure 21E:
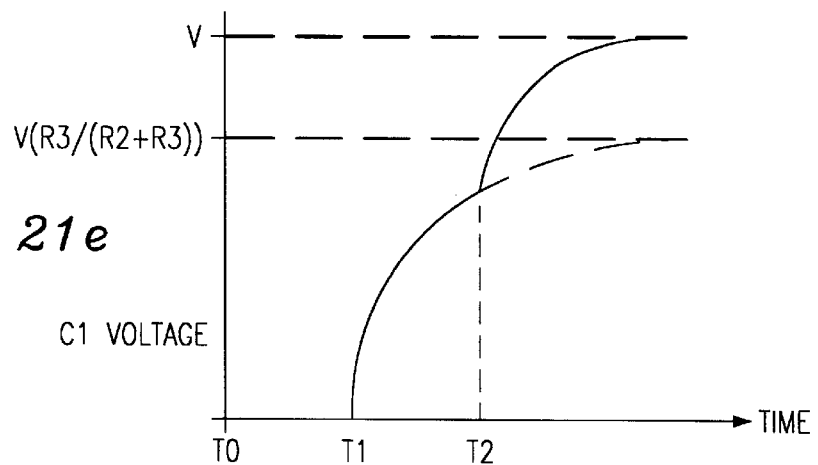
Figure 21F:
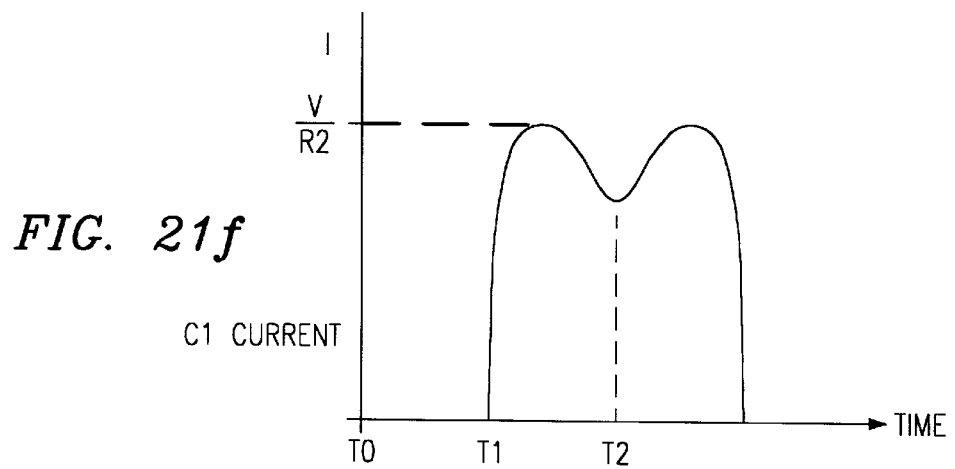

21a–c, FIGS. 21d–f illustrate the heurisitic operation, output voltage, and output current for the output drivers of FIG. 20. Essentially, the output drivers have a two stage operation with a voltage divided first stage in order to limit the maximum current but still rapidly charge the load capacitance by sustaining the maximum current into the second stage. Also, the accurate timing of PSEN\ described in the foregoing Fractional Clock Timing section works with the drivers of FIG. 20 for both fast and slow memories. And as FIG. 17 illustrates, port 0 drivers output the address bits during clock cycle C2 and output the data bits during clock cycle C4.

Figure 22:
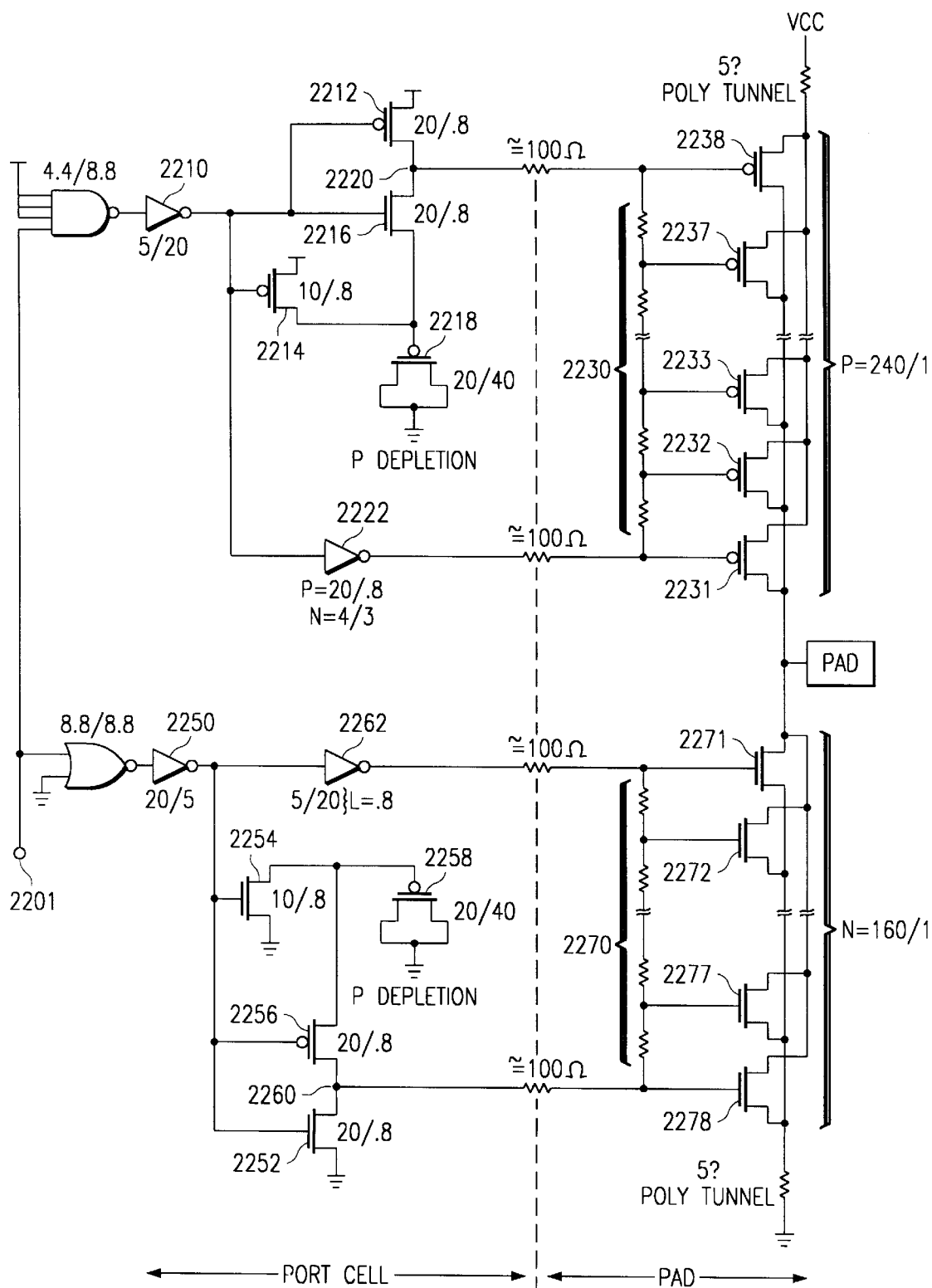
FIG. 22 shows an alternative output driver.

FIG. 22 illustrates an output driver which is structurally simpler than the driver of FIG. 20 but which is used in preferred embodiment 100 for pads which do not need a tristate output. and have a limited load capacitance. First, consider the operation of the driver of FIG. 22 because this will simplify the discussion of the driver of FIG. 20. A low signal at node 2201 drives inverters 2210 and 2250 both low. Inverter 2210 low turns on p-channel FETs 2212 and 2214 turns off n-channel FET 2216 which charges up capacitor 2218 and sets node 2220 high. Inverter 2210 low also drives inverter 2222 high, so the resistor string 2230 has a high at both ends and the gates of parallel p-channel FETS 2231–2238 are all high and the FETs are turned off. Contrarily, inverter 2250 low turns off n-channel FETs 2252 and 2254 turns on p-channel FET 2256 which connects capacitor 2258 to node 2260. Inverter 2250 low also drives inverter 2262 high, so capacitor 2258 charges up through resistor string 2270 until all of the gates of parallel n-channel FETS 2271–2278 are all high and the FETs are turned on. Thus the output PAD is pulled low.

When the signal at node 2201 switches high, inverters 2210 and 2250 both switch high. Inverter 2210 going high turns off FETs 2212 and 2214 and turns on FET 2216 to connect node 2220 to charged up capacitor 2218. Inverter 2210 high drives inverter 2222 low, so capacitor 2218 discharges through resistor string 2230. This discharge through resistor string 2230 implies the voltages on the gates of FETs 2231–2238 are decreasing and that the gate voltage for FET 2231 is lower than that of FET 2232 which, in turn, is lower than that of FET 2233, and so forth. Thus initially, FET 2231 is turned on, whereas FET 2238 remains off, and the FETs in between are in various stages of turning on. Then as capacitor 2218 discharges, the FETs turn on harder until all FETs 2231–2238 are turned on hard. Because FETs 2231–2238 are in parallel, the pull up current increases as capacitor 2218 discharges. Contrarily, inverter 2250 going high turns FETs 2252 and 2254 to discharge capacitor 2258 directly to ground and pull node 2260 to ground. Inverter 2250 high also drives the output of inverter 2262 low; thus both ends of resistor string 2270 are low and all FETs 2271–2278 turn off to release the pull down of the output PAD.

When the signal at node 2201 returns low, the complementary switching occurs so that FETs 2231–2238 quickly turn off to release the pull up and FETs 2271–2278 turn on sequentially as capacitor 2258 charges up. Thus the driver of FIG. 22 provides a pull up or pull down current with limited slewing to avoid ringing.

Figure 23A:
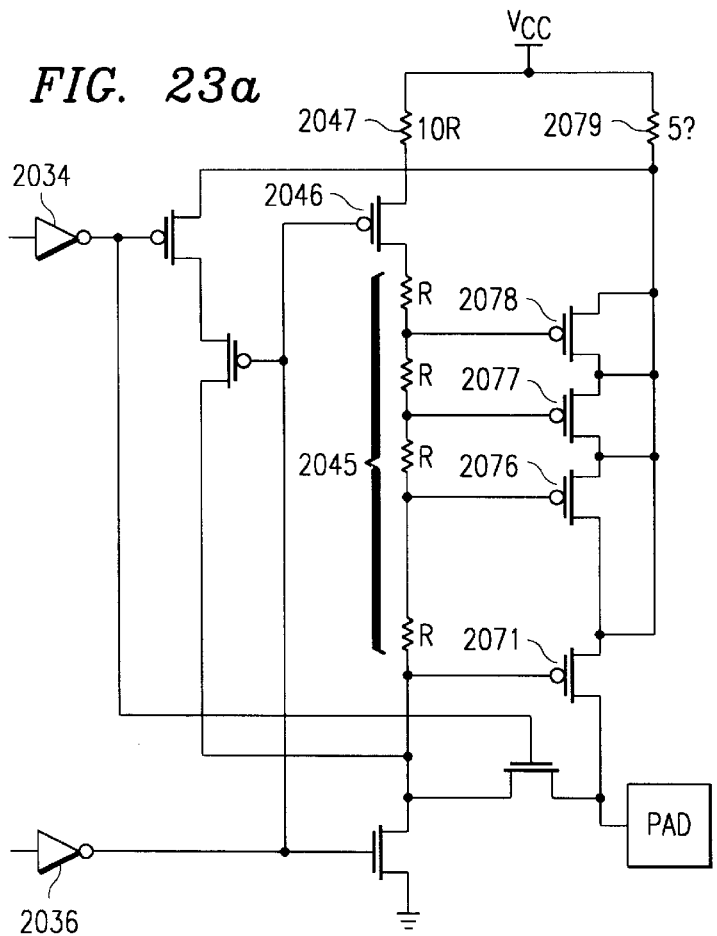
FIGS. 23a–d illustrate operation of the two-stage output driver.
Figure 24:
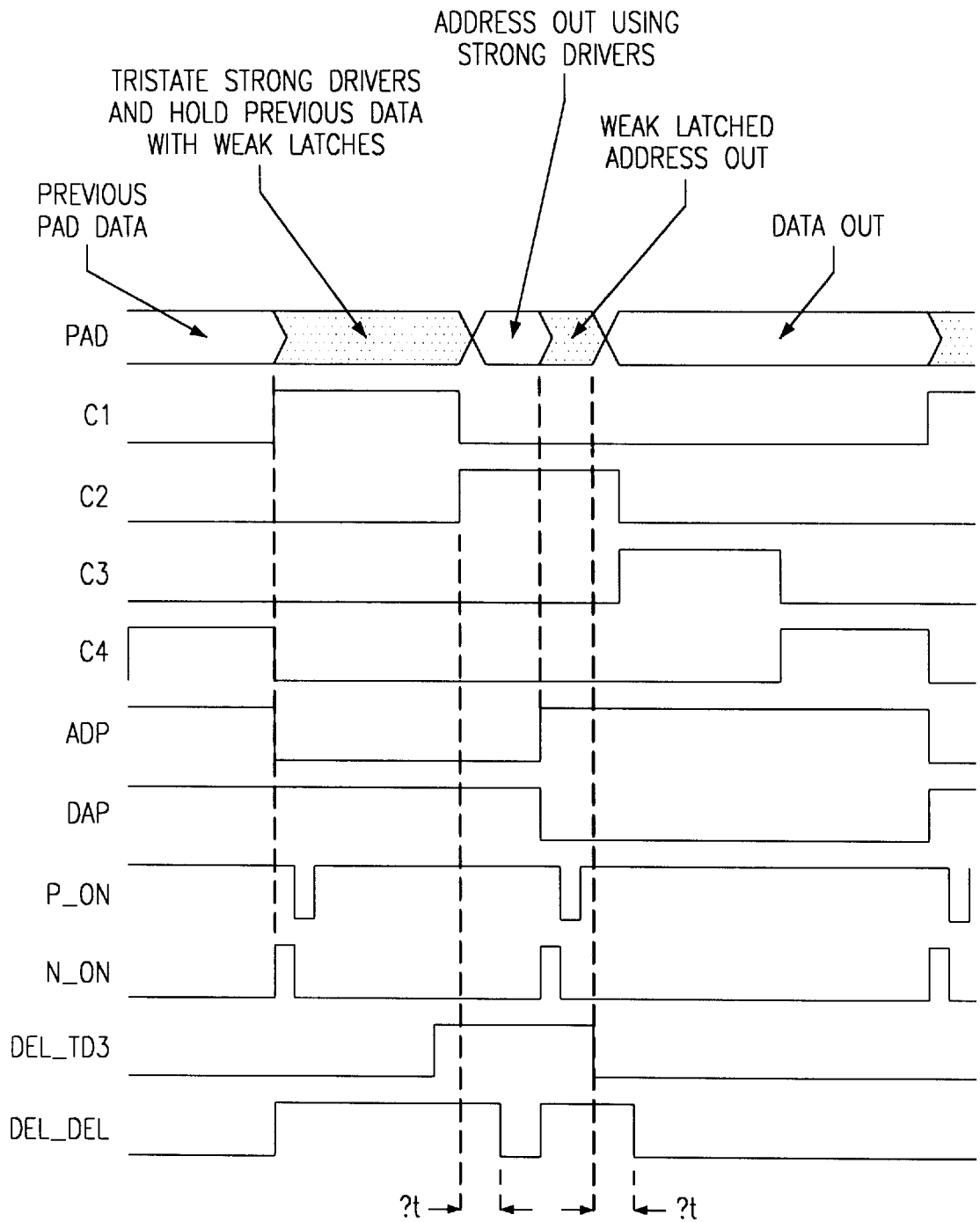
FIG. 24 is a timing diagram for the two-stage output driver.

The operation of the driver of FIG. 20 will now be considered. Initially, note that the two circled portions in FIG. 20 each abbreviates eight parallel FETs as a single FET 2070 or 2090; in fact, each circled portion includes the same structure as the corresponding eight parallel FETs in FIG. 22 as just described. FIG. 23a explicitly shows the upper circled portion in FIG. 20 with FETs 2071–2078 which are represented by FET 2070 in FIG. 20. Of course, different numbers of parallel FETs could be used, such as only four FETs, and still achieve the desired effects. Now the driver of FIG. 20 essentially turns on a limited voltage pull up or pull down during a high going signal on line C1 (address output) or line DEL_TD3 (data output) in either the upper or lower circled portion (depending on whether a 1 or 0 is to be output), and then after a time interval a high going DEL_DEL will turn off the divided voltage source and turn on the full voltage source. In more detail, FIG. 24 shows the timing for the operation as follows.

First, a C4 high clock turns on transmission gates 2002 and 2004 and an address bit on line ADDRESS sets latch 2006 and a data bit on line DATA sets latch 2008. C4 high also makes transmission gate 2010 conduct to transfer the bit held in data input latch 2012 to latch 2014 for transfer onto internal line DATA BUS A while C1_DATA is low.

Figure 23B:
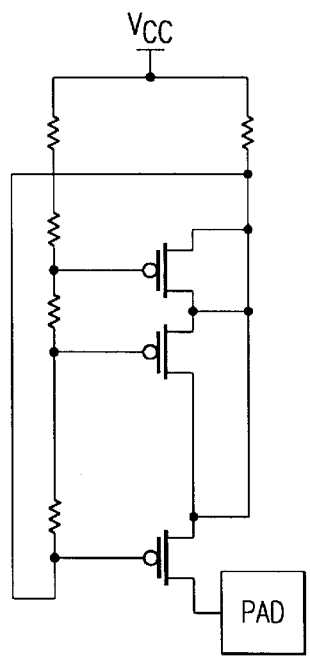

Next, C1 goes high, line ADP (address precharge) goes low, and line N_ON has a high pulse. The high pulse on line N_ON turns on n-channel FETs 2016–2019 to connect latches 2030, 2032, 2050, and 2052 each to ground and thereby reset them. The reset latches put the driver into a high impedance output state (tristate) as follows. Latch 2030 reset turns off transmission gate 2040 and turns on pull up p-channel FET 2041; this drives the output of inverter 2034 low. Similarly, latch 2032 reset turns off transmission gate 2042 and turns on pull up p-channel FET 2043 to drive the output of inverter 2036 low. With the outputs of inverters 2034 and 2036 both low, n-channel FET 2044 and 2048 are both turned off and p-channel FETs 2035, 2037, and 2046 are all turned on to pull up the gates of p-channel FETs 2070 and thus turn them off. FIG. 23b is a simplified version of FIG. 23a and just shows the connections when the outputs of both inverters 2034 and 2036 are low. This isolates PAD from the positive power supply. Analogously, reset latches 2050 and 2052 turn off transmission gates 2060 and 2062 and turn on pull ups 2061 and 2063 to thereby turn off p-channel FETs 2064 and 2068 and turn on n-channel FETs 2055, 2057, and 2066 to pull down the gates of n-channel FETs 2090 to ground and turn them off to isolate PAD from ground. Hence, the driver FETs 2070 and 2090 are both turned off and, with the exception of weak latch 2012, PAD is tristated.

Then N_ON returns low to release the latch resets and P_ON has a low pulse to load the address bit and its complement into the latches. In particular, presume the address bit equals 1; then latches 2030 and 2032 are set, whereas latches 2050 and 2052 remain reset and PAD remains isolated from ground. The setting of latches 2030 and 2032 turns on transmission gates 2040 and 2042 and turns off pull up FETs 2041 and 2043. Hence, at this time a high C1 passes through to inverter 2034 and DEL_DEL (high) passes through to inverter 2036 (HDD is low). In this initial state the high C1 drives the output of inverter 2034 low to continue the previous low and keep FETs 2070 turned off; however, the transmission gates are now ready to rapidly pass a transition to low by C1 and switch FETs 2070 on.

Figure 23C:
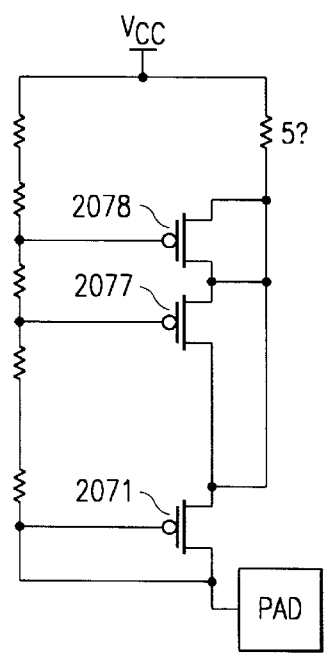

When C1 is makes a transition to low, the output of inverter 2034 switches from low to high and turns off FET 2035 plus turns on n-channel FET 2044; the output of inverter 2036 remains low due to the high on DEL_DEL. This initial state provides a bias of the gates of FETs 2070 by the voltage division along resistor string 2045 plus resistor 2047 through FETs 2044 and 2046 from Vcc to PAD. Thus when the voltage on PAD is low, FETs 2070 are turned on (with FET 2071 turned on the hardest and FET 2078 the weakest analgous to the operation of the driver of FIG. 22). And as the voltage on PAD pulls up, the gate bias on FETs 2070 decreases to slow the current increase. FIG. 23c is another simplified version of FIG. 23a and just shows the connections when the output of inverter 2034 is high and the output of inverter 2036 is low. The graduated bias of parallel FETs 2071–2078 provides a more sophisticated current limitation than the heuristic of FIG. 21d.

Figure 23D:
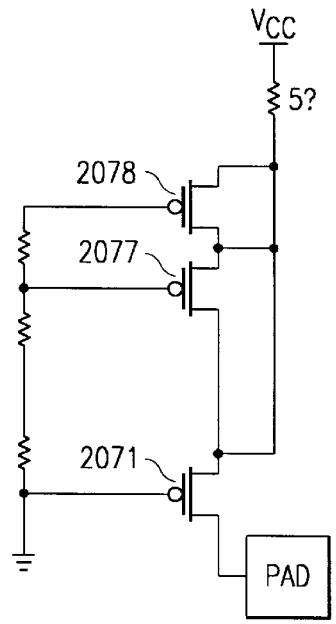

A few nanoseconds after C1 has transitioned low to bias FETs 2070 as shown in FIG. 23c and thereby start the pull up of PAD, DEL__DEL transitions low to both switch the output of inverter 2036 high and the output of inverter 2034 back low. DEL__DEL low directly switches the output of inverter 2036 and also turns on n-channel FET 2005 (and 2007) to reset latch 2030 (and 2050) to turn off transmission gate 2040 (and 2060) to cutoff the low C1 and switch the output of inverter 2034 back low. Inverter 2036 with a high output turns off p-channel FET 2048 which disconnects the gates of FETs 2071–2078 from the Vcc supply and turns on n-channel FET 2048 to pull down the gates of FETs 2071–2078 to ground and thereby turn them all on hard to continue the maximum current charging up PAD (the second local maximum in FIG. 21c). FIG. 23d is the last simplified version of FIG. 23a and just shows the connections when inverter 2034 is low and inverter 2036 is high. Thus the limited maximum current has been achieved.

A symmetrical biasing of n-channel FETs 2090 and consequent maximum current limitation occurs when the address bit transferred is a 0. Indeed, latches 2030 and 2032 will remain reset to turn off transmission gates 2040 and 2042, respectively, and latches 2050 and 2052 will be set to turn on transmission gates 2060 and 2062, respectively, and turn off pull ups 2061 and 2063 during the P__ON low pulse. This then passes a transition low by C1 to start the first stage of PAD pull down with graduated bias of FETs 2090 by resistor string 2065 plus resistor 2067 connecting through FET 2064 to PAD and through FET 2066 to ground. Then DEL__DEL transitioning low after C1 has transitioned low turns on p-channel FET 2068 and turns off n-channel FET 2066 to pull up the gates of FETs 2090 and turn them on hard to continue the maximum current pull down of PAD. DEL__ DEL low also turns on n-channel FET 2007 which resets latch 2050 to block C1. This is all analogous to the operation described for address bit 1 but is simpler due to the substitution of nodes 2054 and 2056 for inverters 2034 and 2036.

After the address bit has been output following C1, the data bit is output analogously by ADP going high to isolate the address bit, DAP (data precharge) going low to connect the data bit from latch 2008, and DEL__TD3 transitioning low to take the place of C1 transitioning low. As FIG. 24 shows, N__ON has a second high pulse, which again resets the latches 2030, 2032, 2050, and 2052, and a low P__ON follows to transfer the data bit and DEL__TD3 transitions low to start the first stage pull up or pull down of PAD. Again DEL__DEL transitions low to start the second stage and continue the maximum charging current.

The time interval, Δt in FIG. 24, from the C1 transition low to the DEL__DEL transition low ranges between about 2 nanoseconds and 12 nanoseconds depending upon the power supply voltage. The time interval from the DEL__ TD3 transition low to the second DEL__DEL transition low may also equal Δt. With a high power supply voltage (such as 6 volts), the stronger performance of devices leads to larger currents and a greater likelihood of ringing; whereas, with lower power supply voltages (such as 4 volts) the likelihood of ringing decreases and less of a time interval can be used. A simple analog circuit can generate a time interval roughly linearly depending upon power supply voltage.

Note that p-channel FETs 2035 and 2037 are used to complement p-channel FET 2046 when the N__ON signal goes high. Since the resistors 2045 and 2047 limit the current required to disable p-channel FETs 2070, it is helpful to pull both ends of the resistor string 2045 to a high to reduce the RC time constant of charging each of the gates associated with FETs 2070. This reduces the time requried to tristate FETs 2070. Devices 2035 and 2037 are required in a series fashion to allow the above outlined operation when either the output of inverter 2034 or 2036 is high but to work in series when both 2034 and 2036 have low outputs. N-channel FETs 2055 and 2057 work in an analogous manner to p-channels 2035 and 2037. When nodes 2056 and 2054 are both pulled high the n-channel FETs 2055 and 2057 will complement n-channel FET 2066 to pull down the resistors 2065 and the gates of n-channel FETs 2090. Resistor 2079 is much smaller than resistor 2047 and resistor 2099 is much smaller than resistor 2067.

Clock Governor

Figure 25:
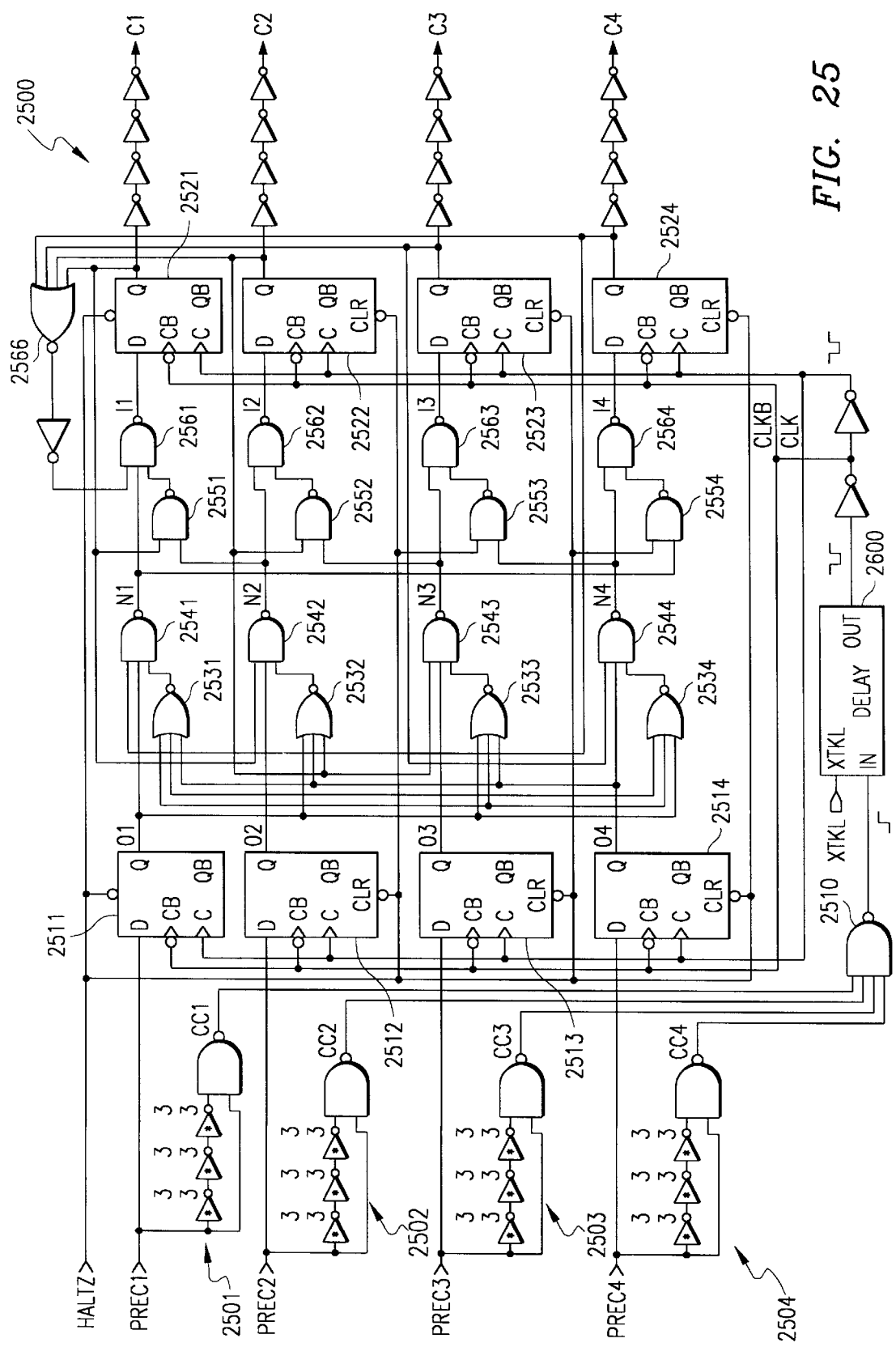
FIGS. 25–26 show the clock governor of the first preferred embodiment.
Figure 26:
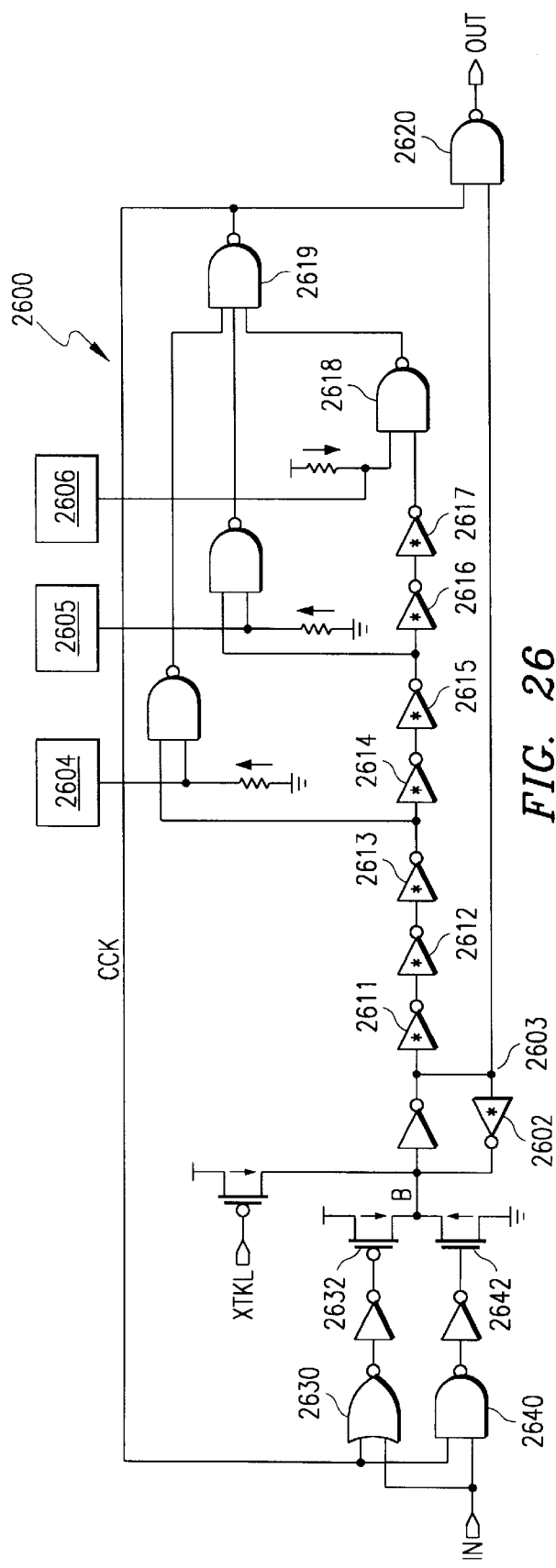

The clock phases C1, C2, C3, and C4 must not overlap and must remain synchronized for proper instruction execution. FIG. 25 shows clock governor 2500 for embodiment 100 as including the four preliminary clock phase inputs PREC1, PREC2, PREC3, and PREC4 and the four clock phase outputs C1, C2, C3, and C4. Governor operates as follows. A rising edge of one of PREC 1, . . . PREC4 drives the corresponding one of the one-shot subcircuits 2501–2504 to generate a low-going pulse of duration determined by the delay of the three inverters in the one-shot, typically 3 ns. Such a low-going pulse drives NAND gate 1510 to output a high pulse into delay line 2600 shown in FIG. 26. Delay line 2600 includes memory cell 2602 with output node 2603 and, presuming the delay shorting pads 2604–2606 are all unconnected, rising edge one-shot made of inverters 2611–2617 and NAND gates 2618–2620. Thus memory cell switching from a low output to a high output generates a low pulse at OUT with width equal to the propagation delay through inverters 2611–2617 and NAND gates 2618–2619 (about 10 ns). The feedback from NAND gate 2619 to NOR gate 2630 and NAND gate 2640 couples with the IN input to yield a steady state with IN=0 and memory cell with 0 output. Then a rising edge at IN will drive NAND gate 2640 low to turn on pull down 2642 to switch memory cell 2602 and 2603 rises to high; this generates the one-shot low at OUT, and the same signal propagation (i.e., NAND gate 2619 low) feeds back to drive NAND gate 2640 high (if IN has not already returned low and done so) to turn off pull down FET 2642 and to drive NOR gate 2630 high once IN is low. But NOR gate 2630 high and NAND gate 2640 low imply a pull up at the input of memory cell 2602 and the output switches low. This low propagates via the feedback to then turn off pull up FET 2632 and a return to the steady state. Thus delay line 2600 generates a low going pulse for a rising edge input. Further, if a second high pulse appears at IN while memory cell 2602 is still high from a first pulse at IN, the second pulse will be ignored due to the feedback and memory cell bit retention while pull up FET 2632 and pull down FET 2642 are both turned off. This limits the clock speed so as to not exceed the speed of the device.

A low-going pulse from delay line 2600 clocks flip-flops 2511–2514 and 2521–2524 on the trailing rising edge. Clocking flip-flops 2511–2514 loads them with the current PREC1, . . . PREC4 and loads flip-flops 2521–2524 will the current output of NAND gates 2561–2564 which become the C1, . . . C4 outputs. Recall that the low-going pulse is triggered by a rising edge in one of PREC1, . . . PREC4 and the nominal duration of PREC1, . . . PREC4 is about 40 ns minimum (25 MHz crystal) while the delay from delay line 2600 is about 10 ns. Thus the expected situation is for one of the PREC1, . . . PREC4 to be high and one of flip-flops 2511–2514 to be clocked into the Q=1 state with the three other flip-flops in Q=0. NOR gates 2531–2534 plus NAND gates 2541–2544, 2551–2554, and 2561–2564 insure that at most one of the flip-flops 2521–2524 has Q=1 and that the flip-flops go high in sequence; that is, no two of C1. . . C4 are high simultaneously and C4 follows C3 which follows C2 . . . .

For example, first consider the case of PREC2 going high while NAND gate 2561 is high and NAND gates 2562–2564 are low. Then the rising edge of PREC2 triggers delay line 2600 to output a low-going pulse which clocks the flip-flops to load 1 into flip-flop 2512, 0 into flip-flops 2511, 2513–2514, 1 into flip-flop 2521, and 0 into flip-flops 2522–2524. The Q=1 from flip-flop 2512 drives NOR gates 2531, 2533–2534 low and thus NAND gates 2541, 2543–2544 high. The Q=0 from flip-flops 2511, 2513–2514 sets NOR gate 2532 high. And the Q=1 from flip-flop 2521 (C1=1) provides the third high input to NAND gate 2542 which is then low and this drives NAND gate 2562 high. The other NAND gates 2561, 2563–2564 are all low: NAND gate 2563 and 2564 have high inputs due to NAND gates 2553–2554 being driven by the lows loaded in flip-flops 2523–2524, and NAND gate 2561 is low because NAND gate 2551 has the same low input from NAND gate 2542 as NAND gate 2562. Thus on the next clocking flip-flop 2522 (C2) will go high and the other three 2521, 2523–2524 will go low. Note that the feedback from flip-flop 2521 (C1) to NAND gate 2542 permits C2 to follow C1. Similar feedbacks provide for C3 to follow C2, . . . Also, if C1 is high but PREC2 is low, then NAND gate 2551 will be low and drive NAND gate 2561 high so that at the next clocking flip-flop 2521 will retain its high. In general, when a following PRECj is not high then C(j−1) will retain its high.

When two or more of the PREC 1, . . . PREC4 are high at a clocking of the flip-flops, then two or more of the flip-flops 2511–2514 will be set to Q=1, and this implies that all NOR gates 2531–2534 are low and, consequently, all NAND gates 2541–2544 are high. Similarly, if all of the PREC1, . . . PREC4 are low at a clocking, then NAND gates 2541–2544 are directly set high. Then each of the NAND gate pairs 2551–2561, 2552–2562, 2553–2563, and 2554–2564 is equivalent to two inverters in series for the feedback from the corresponding flip-flop 2521–2524. Thus at the next clocking of the flip-flops, there is no change in C1, . . . C4. That is, governor 2500 simply preserves the current C1, . . . C4 status when none or two or more of the PREC1, . . . PREC4 are simultaneously high at a flip-flop clocking. Lastly, if all of C1, . . . C4 are low, then NOR gate 2566 will drive NAND gate 2561 high to preclude an all zero lockup.

Ring Oscillator

Figure 27:
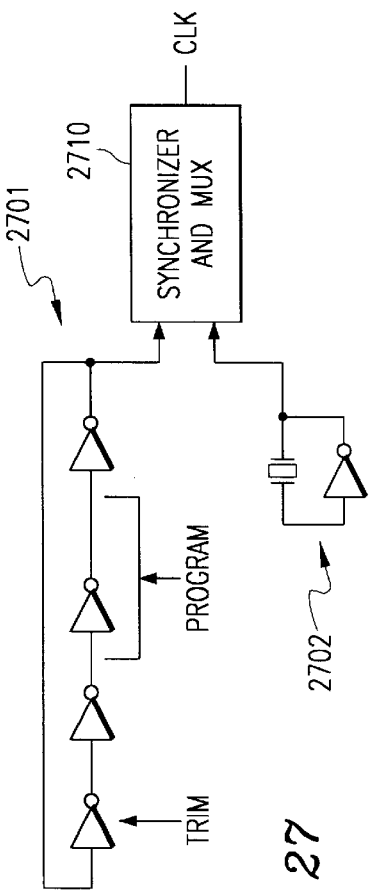
FIG. 27 shows crystal and ring oscillators for clock generation.

Preferred embodiment 100 includes a ring oscillator 2701 to provide a clock during a recovery from a STOP mode. In particular, a system in STOP mode turns off crystal oscillator 2702; and upon exiting the STOP mode, crystal oscillator 2702 may take 2–4 milliseconds to stabilize and be usable as the clock. During this recovery time, ring oscillator 2701 provides embodiment 100 with a clock and at the expiration of a few millisecond period embodiment switches from ring oscillator to crystal oscillator for its clock as illustrated in FIG. 27. Synchronizer and multiplexer 2710 insures a smooth transition. The ring oscillator thus permits use of the power fail monitoring circuits of embodiment during the recovery from STOP. That is, a power fail interrupt routine can be performed using the ring oscillator clock during the recovery and prior to a reset generated by the power failure. The use of the ring oscillator is optional and determined by a ring select (RGSL) bit in a register. And during use of the ring oscillator as the clock, a ring mode (RGMD) bit in a register is set.

Ring oscillator 2701 can be programmed for frequency and trimmed digitally by bits stored in nonvolatile RAM. Alternatively, EPROM storage could be used. Trimming to within 5% accuracy would permit use of frequency sensitive operations such as RS232 communications. The voltage source for ring oscillator 2701 derives from a bandgap generator. This effectively provides supply voltage variation compensation. Similarly, temperature variations can be compensated by additional circuitry.

Watchdog

Embodiment 100 includes a watchdog timer. Watchdog timer functions as a source for both a Watchdog Interrupt and a Watchdog Reset. The interrupt time has a default devide ratio of $2^{17}$ of the crystal oscillator clock, with the Watchdog Reset set to time-out 512 clock cycles later. This results in a 25 MHz crystal oscillator producing an interrupt time-out every 5.24 milliseconds, followed 20.5 microseconds later with a Watchdog Reset. The Watchdog Timer is reset to the default divide ratio, following any Reset. Using the WD0 and WD1 bits in the clock Control Register, divide ratios of $2^{20}$, $2^{23}$, and $2^{26}$ can be selected for longer Watchdog Timer interrupt periods. All Watchdog Timer Reset time-outs follow the programmed interrupt time-outs by 512 oscillator cycles. If the Watchdog Timer Reset function is masked by the Watchdog Timer Enable (EWT) bit and no resets are issued to the timer via the Reset Watchdog Timer (RWT) bit in the WDREG regsiter, the Watchdog Timer will generate interrupts at a periodic rate associated with the programmed divide ratio. Further Modifications and Variations Modifications and variations of the preferred embodiments may be made while retaining the features of one or more extra busses which express the contents of one or more certain registers so that register indirect addressing does not require a separate read of the contents but rather just a decoding of the instruction opcode to select the extra bus for address information. For example, different width busses (1-bit, 4-bit, 16-bit, 32-bit, and so forth) could be used, just one or more than the two register contents busses R0(7:0) and R1(7:0) could be used, fewer than all of the bits of the registers could be on extra busses, more internal busses in addition to DA(7:0) and DB(7:0) could be used, a different subdivision of a machine cycle into subintervals could be used.

What is claimed is:

1. A micro controller capable of indirect addressing comprising:

a data bus;

a memory having at least one register;

a bank select circuit coupled to said memory so as to directly couple a given one of said at least one registers to said data bus such that the contents are directly placed on said bus;

wherein the contents of a selected register is provided directly to said data bus, as an address for the completion of an instruction and wherein from the data bus to the selected one of said at least one register, is a read only path to the data bus from the register and wherein said selected at least one register has a fixed address and further wherein the contents of said at least one register directly provides the address for a byte of data which is the address for an instruction to be executed by said micro controller, such that the providing of the address occurs such that the full instruction can be completed within one clock cycle of said micro controller.

2. A micro controller as in claim 1 wherein said memory is organized in at least two banks and wherein each bank has at least two resisters.

3. A micro controller capable of indirect addressing comprising:
   a data bus;
   a memory having at least one indirect addressing address register;
   a bank select circuit coupled to said memory so as to directly couple a given one of said at least one indirect addressing address registers to said data bus such that the contents are directly placed on said bus;
   wherein the contents of a selected indirect addressing address register is provided directly to said data bus, so as to supply an address for the completion of an instruction and wherein from the data bus to the selected one of said at least one indirect addressing address register, is a read only path to the data bus from the indirect addressing address register and wherein said selected at least one indirect addressing address register has a fixed address and further wherein the contents of said at least one indirect addressing address register directly provides the address for a byte of data which is the address for an instruction to be executed by said micro controller, such that the providing of the address occurs such that the full instruction can be completed within one clock cycle of said micro controller.

4. A micro controller as in claim 3 wherein said memory is organized in at least two banks and wherein each bank has at least two indirect addressing address registers.

* * * * *